(12) United States Patent
Kang et al.

(10) Patent No.: US 12,557,695 B2
(45) Date of Patent: Feb. 17, 2026

(54) DISPLAY DEVICE INCLUDING A FIRST ALIGNMENT MARK AND METHOD FOR FABRICATING THE SAME

(71) Applicant: Samsung Display Co., Ltd., Yongin-si (KR)

(72) Inventors: Suk Hoon Kang, Seoul (KR); Hyung Guen Yoon, Hwaseong-si (KR); Beom Soo Shin, Hwaseong-si (KR); Ji Yoon Jung, Asan-si (KR); Sung Hwan Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 602 days.

(21) Appl. No.: 17/454,216

(22) Filed: Nov. 9, 2021

(65) Prior Publication Data

US 2022/0285465 A1    Sep. 8, 2022

(30) Foreign Application Priority Data

Mar. 3, 2021    (KR) ........................ 10-2021-0028008

(51) Int. Cl.
*H01L 25/075*    (2006.01)
*H10K 59/12*    (2023.01)
(Continued)

(52) U.S. Cl.
CPC ....... *H01L 25/0753* (2013.01); *H10K 59/122* (2023.02); *H10K 59/131* (2023.02);
(Continued)

(58) Field of Classification Search
CPC ... H10K 59/122; H10K 50/865; H01L 33/504
See application file for complete search history.

(56) References Cited

U.S. PATENT DOCUMENTS

2007/0090365 A1\* 4/2007 Hayashi ............... H10K 59/123
257/72
2013/0082909 A1\* 4/2013 Miura .................. H10K 59/879
345/76
(Continued)

FOREIGN PATENT DOCUMENTS

KR    10-2016-0015815 A    2/2016
KR    10-2019-0048986 A    5/2019
KR    10-2019-0090905 A    8/2019

*Primary Examiner* — Lex H Malsawma
*Assistant Examiner* — Bruce R. Smith
(74) *Attorney, Agent, or Firm* — Womble Bond Dickinson (US) LLP

(57) ABSTRACT

According to some embodiments of the present disclosure, a display device includes: a substrate; a planarization layer on the substrate; a first alignment mark in a non-display area of the substrate; a first electrode and a second electrode in a display area of the substrate; a light emitting element electrically connected to the first electrode and the second electrode; a wavelength conversion layer on the light emitting element; a first bank on at least a part of the first electrode; and a second bank on the first bank to be around the wavelength conversion layer. A thickness of a part of the planarization layer that overlaps the first alignment mark in a thickness direction of the substrate is greater than a thickness of a part of the planarization layer that overlaps the first electrode and the second electrode in the thickness direction of the substrate.

16 Claims, 36 Drawing Sheets

(51) Int. Cl.
*H10K 59/122* (2023.01)
*H10K 59/131* (2023.01)
*H10K 59/80* (2023.01)
*H10K 71/00* (2023.01)

(52) U.S. Cl.
CPC ......... *H10K 59/8792* (2023.02); *H10K 71/00* (2023.02); *H10K 59/1201* (2023.02)

(56) References Cited

U.S. PATENT DOCUMENTS

| | | | |
|---|---|---|---|
| 2013/0309793 A1* | 11/2013 | Park | H10K 71/00 |
| | | | 438/29 |
| 2016/0211309 A1* | 7/2016 | Seo | H10K 59/124 |
| 2017/0125740 A1* | 5/2017 | Lee | H10K 50/19 |
| 2017/0240728 A1* | 8/2017 | Lee | G02F 1/133617 |
| 2019/0018286 A1 | 1/2019 | Kim et al. | |
| 2020/0013766 A1* | 1/2020 | Kim | H01L 25/167 |

\* cited by examiner

DISPLAY DEVICE INCLUDING A FIRST ALIGNMENT MARK AND METHOD FOR FABRICATING THE SAME

CROSS-REFERENCE TO RELATED APPLICATION

This application claims priority to and the benefit of Korean Patent Application No. 10-2021-0028008, filed on Mar. 3, 2021, in the Korean Intellectual Property Office (KIPO), the entire content of which is incorporated by reference herein.

BACKGROUND

1. Field

The present disclosure relates to a display device and a method for fabricating the same.

2. Description of the Related Art

The importance of display devices has steadily increased with the development of multimedia technology. In response thereto, various types of display devices such as an organic light emitting diode (OLED) display, a liquid crystal display (LCD) and the like have been used. A display device is a device for displaying an image, and includes a display panel, such as a light emitting display panel or a liquid crystal display panel.

During the fabricating process of the display device, a mask is required to deposit a metal wire or a metal electrode, or to deposit an organic insulating layer or an inorganic insulating layer. Here, the display panel and the mask may be aligned with each other by using an alignment mark of the display panel and an alignment mark of the mask.

SUMMARY

Aspects of embodiments of the present disclosure provide a display device capable of improving alignment accuracy between a display panel and a mask.

Aspects of embodiments of the present disclosure provide a method for fabricating a display device capable of improving alignment accuracy between a display panel and a mask.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device includes: a substrate; a planarization layer on the substrate; a first alignment mark in a non-display area of the substrate; a first electrode and a second electrode in a display area of the substrate; a light emitting element electrically connected to the first electrode and the second electrode; a wavelength conversion layer on the light emitting element; a first bank on at least a part of the first electrode; and a second bank on the first bank to be around the wavelength conversion layer. A thickness of a part of the planarization layer that overlaps the first alignment mark in a thickness direction of the substrate is greater than a thickness of a part of the planarization layer that overlaps the first electrode and the second electrode in the thickness direction of the substrate.

The planarization layer may include a stepped portion that overlaps the first alignment mark in the thickness direction of the substrate.

A thickness of the stepped portion may be less than a thickness of the second bank in contact with the wavelength conversion layer.

The thickness of the stepped portion may be about 2 μm or more, and may be less than the thickness of the second bank.

At least a part of the second bank may overlap the first alignment mark in the thickness direction of the substrate. The thickness of the part of the second bank that overlaps the first alignment mark may be less than a thickness of a part of the second bank in contact with the wavelength conversion layer.

A light transmittance of the part of the second bank that overlaps the first alignment mark may be greater than a light transmittance of the part of the second bank in contact with the wavelength conversion layer.

A light transmittance of the part of the second bank in contact with the wavelength conversion layer may be about 15% or less, and a light transmittance of the part of the second bank that overlaps the first alignment mark is about 15% or more.

The display device may further include: a barrier layer on the substrate; a channel layer of a thin film transistor on the barrier layer; a gate insulating layer on the channel layer of the thin film transistor; a gate electrode of the thin film transistor on the gate insulating layer; an interlayer insulating layer on the gate electrode of the thin film transistor; and a first power supply line on the interlayer insulating layer, where a first power voltage is applied to the first power supply line.

The first alignment mark may be on the interlayer insulating layer and includes same material as that of the first power supply line.

The first alignment mark may be on the gate insulating layer and includes same material as the gate electrode of the thin film transistor.

The display device may further include a light blocking layer on the substrate. The barrier layer may be on the light blocking layer. The first alignment mark may be on the substrate and includes same material as the light blocking layer.

The first alignment mark may include same material as the first electrode.

The first alignment mark may include a metal material having a reflectance of about 80% or more with respect to light having a wavelength of about 880 nm.

According to some embodiments of the present disclosure, a display device includes: a substrate; a first alignment mark in a non-display area of the substrate; a first electrode and a second electrode in a display area of the substrate; a light emitting element electrically connected to the first electrode and the second electrode; a wavelength conversion layer on the light emitting element; a first bank on at least a part of the first electrode; and a second bank on the first bank to be around the wavelength conversion layer. A thickness of a part of the first bank that overlaps the first alignment mark in a thickness direction of the substrate is greater than a thickness of a part of the first bank that overlaps the first electrode and the second electrode in the thickness direction of the substrate.

The first bank may include a stepped portion that overlaps the first alignment mark in the thickness direction of the substrate.

A thickness of the stepped portion may be less than a thickness of a part of the second bank in contact with the wavelength conversion layer.

A thickness of the stepped portion may be about 2 μm or more, and may be less than a thickness of the second bank.

A part of the second bank may overlap the first alignment mark in the thickness direction of the substrate. A thickness of the part of the second bank that overlaps the first alignment mark may be less than a thickness of a part of the second bank in contact with the wavelength conversion layer.

According to some embodiments of the present disclosure, a method for fabricating a display device, includes: forming a first alignment mark on a substrate; forming an organic layer having a stepped portion overlapping the first alignment mark in a thickness direction of the substrate; forming a bank material on the organic layer; and patterning the bank material using a photolithography process to form a second bank. A thickness of the bank material that overlaps the first alignment mark in the thickness direction of the substrate is less than a thickness of the bank material that does not overlap the first alignment mark in the thickness direction of the substrate.

A light transmittance of the bank material that does not overlap the first alignment mark may be about 15% or less. A light transmittance of the bank material that overlaps the first alignment mark may be about 15% or more.

According to the aforementioned and other embodiments of the present disclosure, because a planarization layer includes a stepped portion that overlaps an alignment mark in the thickness direction of a substrate, when a bank material for forming a bank is formed on the planarization layer during the fabricating process, the thickness of the bank material that overlaps the alignment mark in the thickness direction of the substrate may be smaller than the thickness of the bank material that does not overlap the alignment mark in the thickness direction of the substrate. Because the light transmittance of the bank material is inversely proportional to the thickness of the bank material, the light transmittance of the bank material that overlaps the alignment mark in the thickness direction of the substrate may be higher than the light transmittance of the bank material that does not overlap the alignment mark in the thickness direction of the substrate. Therefore, it is possible to recognize the alignment mark using a camera.

According to the aforementioned and other embodiments of the present disclosure, because a first bank includes a stepped portion that overlaps the alignment mark in the thickness direction of the substrate, when a bank material for forming a second bank is formed on the planarization layer during the fabricating process, the thickness of the bank material that overlaps the alignment mark in the thickness direction of the substrate may be smaller than the thickness of the bank material that does not overlap the alignment mark in the thickness direction of the substrate. Because the light transmittance of the bank material is inversely proportional to the thickness of the bank material, the light transmittance of the bank material that overlaps the alignment mark in the thickness direction of the substrate may be higher than the light transmittance of the bank material that does not overlap the alignment mark in the thickness direction of the substrate. Therefore, it is possible to recognize the alignment mark using the camera.

According to the aforementioned and other embodiments of the present disclosure, because the alignment mark is formed of a metal material having a high reflectance, it may be easy to recognize the alignment mark using the camera.

BRIEF DESCRIPTION OF THE DRAWINGS

The above and other embodiments of the present disclosure will become more apparent by describing embodiments thereof with reference to the attached drawings, in which.

DETAILED DESCRIPTION

Figure 1:
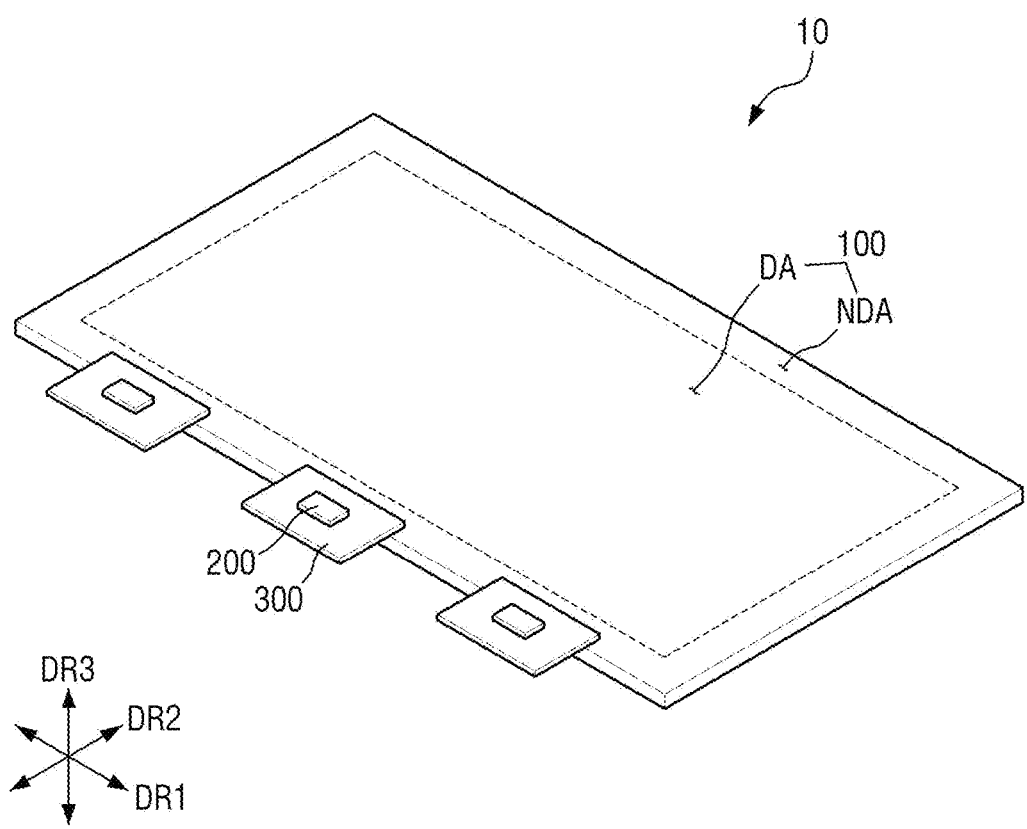
FIG. 1 is a perspective view illustrating a display device according to some embodiments.

Aspects of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of embodiments of the present disclosure to those skilled in the art. Accordingly, processes, elements, and techniques that are not necessary to those having ordinary skill in the art for a complete understanding of the aspects of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device according to some embodiments.

Referring to FIG. 1, a display device 10 according to some embodiments is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

In this specification, an inorganic light emitting display device including an inorganic semiconductor element as a light emitting element is illustrated as an example of the display device 10 according to some embodiments. However, the present disclosure is not limited thereto.

The display device 10 according to some embodiments includes a display panel 100, display driving circuits 200, and circuit boards 300.

The display panel 100 may, in a plan view, be formed in a rectangular shape having long sides in a first direction DR1 and short sides in a second direction DR2 crossing the first direction DR1. The corners formed by meeting of the long sides in the first direction DR1 and the short sides in the second direction DR2 may be rounded to have a desired curvature (e.g., a predetermined curvature) or may be rectangular. The planar shape of the display panel 100 is not limited to the rectangular shape, and may be formed in another polygonal shape, a circular shape, or an elliptical shape. The display panel 100 may be formed to be flat, but is not limited thereto. For example, the display panel 100 may include a curved portion having a desired curvature (e.g., a predetermined curvature) or a varying curvature. Alternatively, the display panel 100 may be formed flexibly so that it can be curved, bent, folded, and/or rolled.

The display panel 100 may include a display area DA displaying an image and a non-display area NDA located around the display area DA. The display area DA may occupy most of the area of the display panel 100. The display area DA may be located at the center (or the central region) of the display panel 100. Pixels PX (see FIG. 2) may be arranged in the display area DA to display an image.

The non-display area NDA may be located adjacent to the display area DA. The non-display area NDA may be an area outside the display area DA. The non-display area NDA may be located to be around (e.g., surround) the display area DA along the edge or periphery of the display area DA. The non-display area NDA may be an edge area of the display area DA.

Display pads may be arranged in the non-display area NDA to be connected to the circuit boards 300. The display pads may be located on one side edge of the display panel 100. For example, the display pads may be located at the lower edge of the display panel 100.

The plurality of circuit boards 300 may be located on the display pads located on one side edge of the display panel 100. Although three circuit boards 300 are illustrated in FIG. 1, the number of circuit boards 300 is not limited thereto.

The circuit boards 300 may be attached to the display pads and scan pads using a low-resistance, high-reliability material such as an anisotropic conductive film, a self-assembly anisotropic conductive paste (SAP) or the like. Accordingly, the circuit boards 300 may be electrically connected to data lines and scan control lines of the display panel 100. The display panel 100 may receive data voltages and scan control signals through the circuit boards 300. The circuit boards 300 may each be a flexible printed circuit board, a printed circuit board, or a flexible film such as a chip on film.

The display driving circuits 200 may generate the data voltages and the scan control signals. The display driving circuits 200 may supply the data voltages and the scan control signals to the display panel 100 through the circuit boards 300. Alternatively, the scan control signals may be generated by a separate timing driving circuit other than the display driving circuits 200 and may be supplied to the display panel 100 through the circuit boards 300.

Each of the display driving circuits 200 may be formed of an integrated circuit (IC) and attached to the circuit board 300. Alternatively, the display driving circuits 200 may be attached onto the display panel 100 by a chip on glass (COG) method, a chip on plastic (COP) method, or an ultrasonic bonding method.

Figure 2:
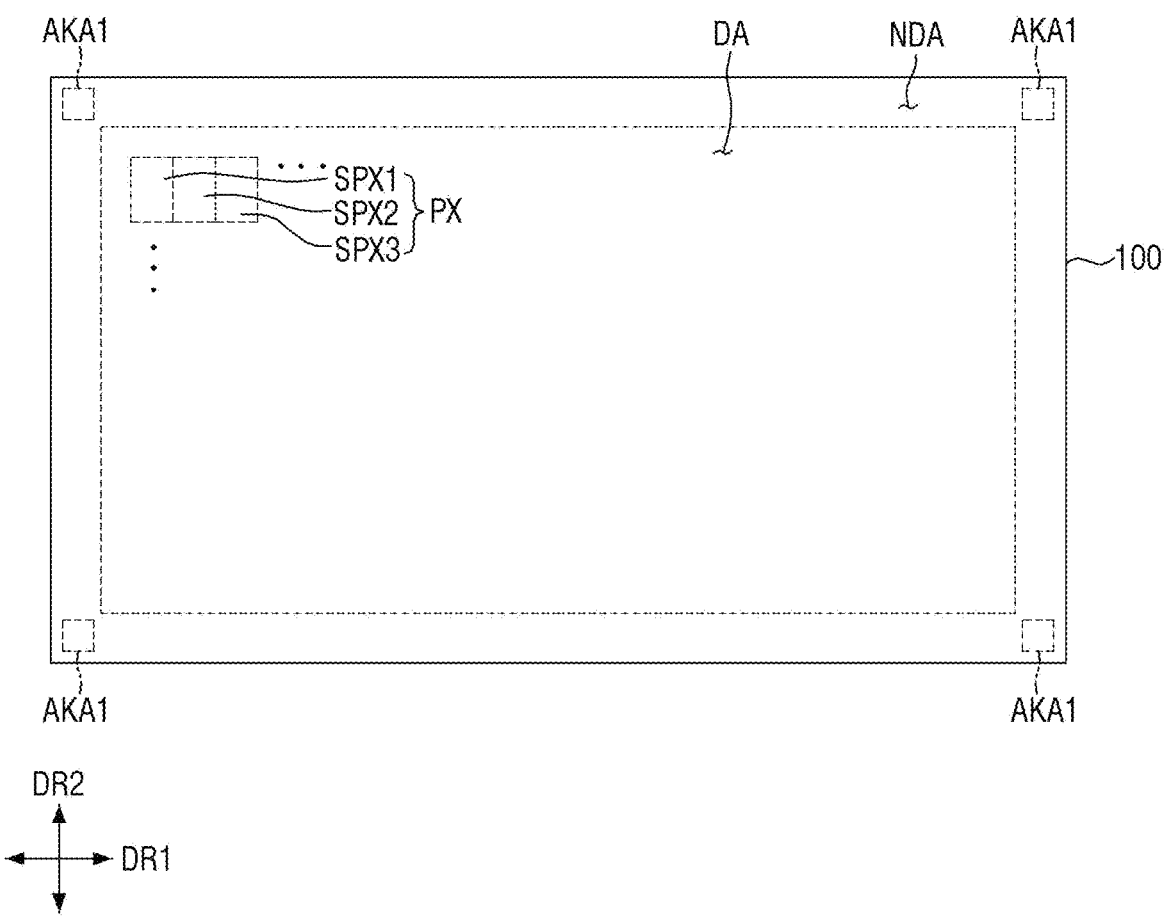
FIG. 2 is a layout diagram illustrating an example of a display panel of FIG. 1.

FIG. 2 is a layout diagram illustrating an example of a display panel of FIG. 1.

Referring to FIG. 2, the display panel 100 according to some embodiments may include a plurality of pixels PX located in the display area DA, and a plurality of first alignment mark regions AKA1 located in the non-display area NDA.

The plurality of pixels PX may be arranged along the first direction DR1 and the second direction DR2 in the display area DA. Each of the plurality of pixels PX may include a plurality of sub-pixels SPX1, SPX2, and SPX3. For example, as shown in FIG. 2, each of the plurality of pixels PX may include three sub-pixels (e.g., a first sub-pixel SPX1, a second sub-pixel SPX2, and a third sub-pixel SPX3), but the number of sub-pixels in each of the plurality of pixels PX is not limited thereto. For example, each of the plurality of pixels PX may include four or more sub-pixels.

The plurality of sub-pixels SPX1, SPX2, and SPX3 may be arranged along the first direction DR1, but the arrangement direction of the plurality of sub-pixels SPX1, SPX2, and SPX3 is not limited thereto. For example, the plurality of sub-pixels SPX1, SPX2, and SPX3 may be arranged along the second direction DR2.

The plurality of first alignment mark regions AKA1 may be located adjacent to the edge of the display panel 100. The plurality of first alignment mark regions AKA1 may be located at the corners of the display panel 100, respectively. For example, when the display panel 100 has a rectangular planar shape as shown in FIG. 2, four first alignment mark regions AKA1 may be located at respective corners of the display panel 100. For example, any one of the plurality of first alignment mark regions AKA1 may be located at a corner where the upper side and the left side of the display panel 100 meet. Any one of the plurality of first alignment mark regions AKA1 may be located at a corner where the upper side and the right side of the display panel 100 meet. Any one of the plurality of first alignment mark regions AKA1 may be located at a corner where the lower side and the left side of the display panel 100 meet. Any one of the plurality of first alignment mark regions AKA1 may be located at a corner where the lower side and the right side of the display panel 100 meet.

However, the number and arrangement positions of the plurality of first alignment mark regions AKA1 are not limited to those shown in FIG. 2. For example, any two of the first alignment mark regions AKA1 may be located adjacent to one side of the display panel 100, and the other two may be located adjacent to the other side opposite to the one side of the display panel 100. For example, any two of the first alignment mark regions AKA1 may be located adjacent to the left side of the display panel 100 and the other two may be located adjacent to the right side of the display panel 100. Alternatively, any two of the first alignment mark regions AKA1 may be located adjacent to the upper side of the display panel 100 and the other two may be located adjacent to the lower side of the display panel 100.

Figure 4:
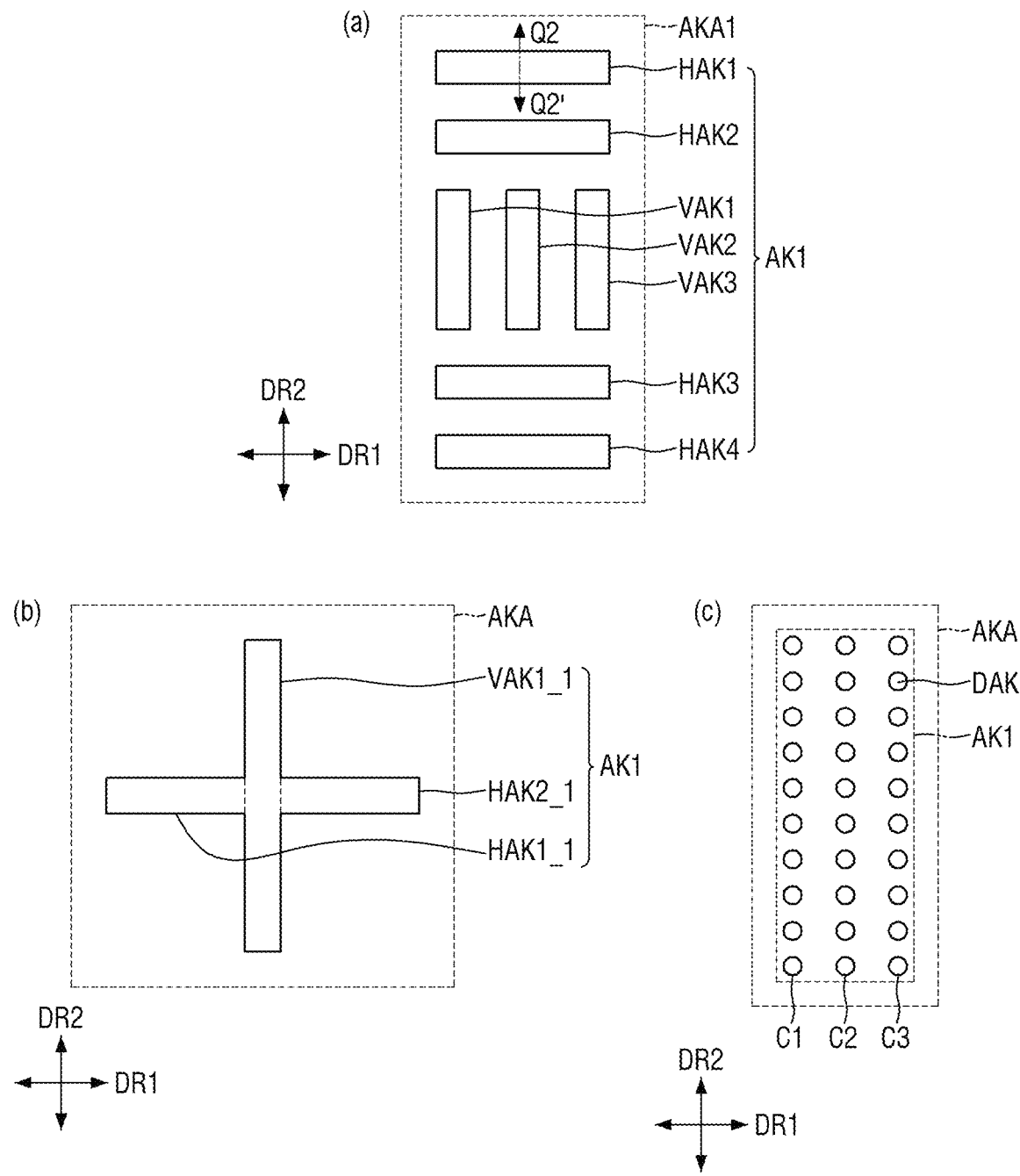
FIG. 4 is an example diagram showing one example of a first alignment mark in a first alignment mark region of FIGS. 2 and 3.

Each of the plurality of first alignment mark regions AKA1 may include a first alignment mark AK1 (see FIG. 4).

A detailed description of the first alignment mark AK1 (see FIG. 4) will be made later with reference to FIG. 4.

Figure 3:
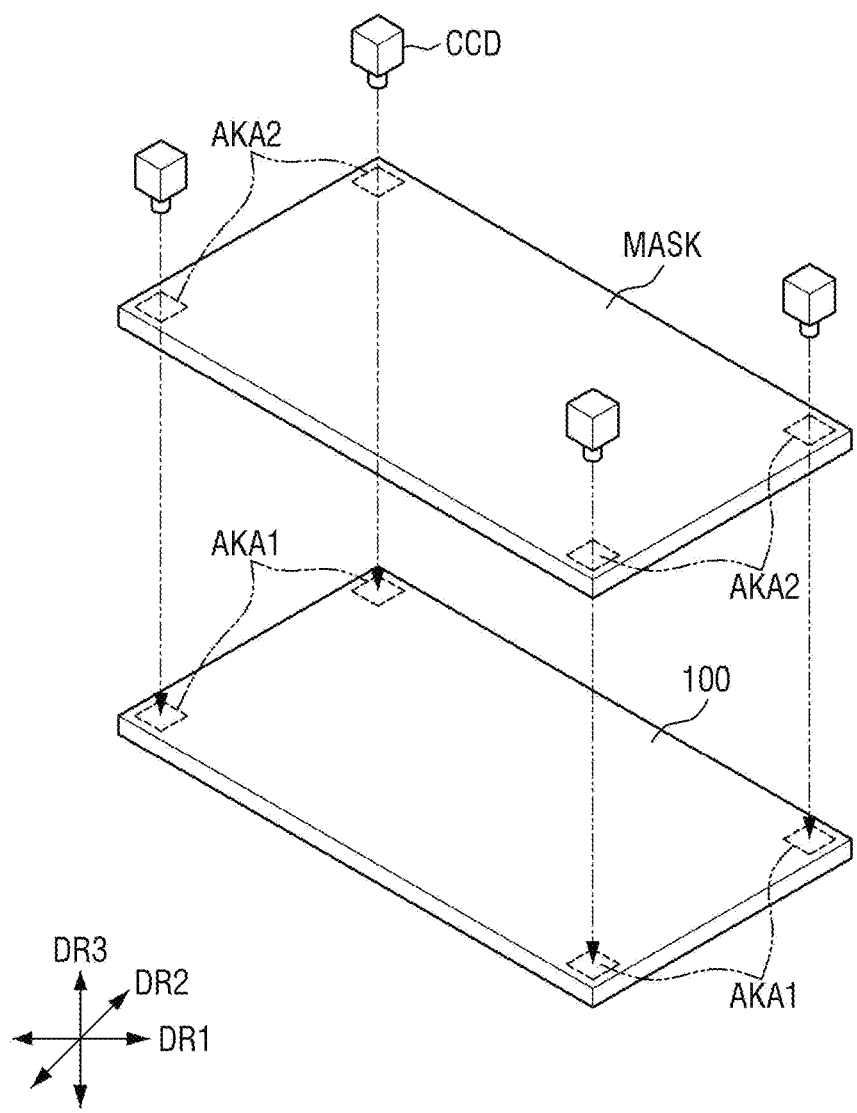
FIG. 3 is one example diagram showing alignment of first alignment mark regions of a display panel and second alignment mark regions of a mask during the fabricating process of the display panel.
Figure 5:
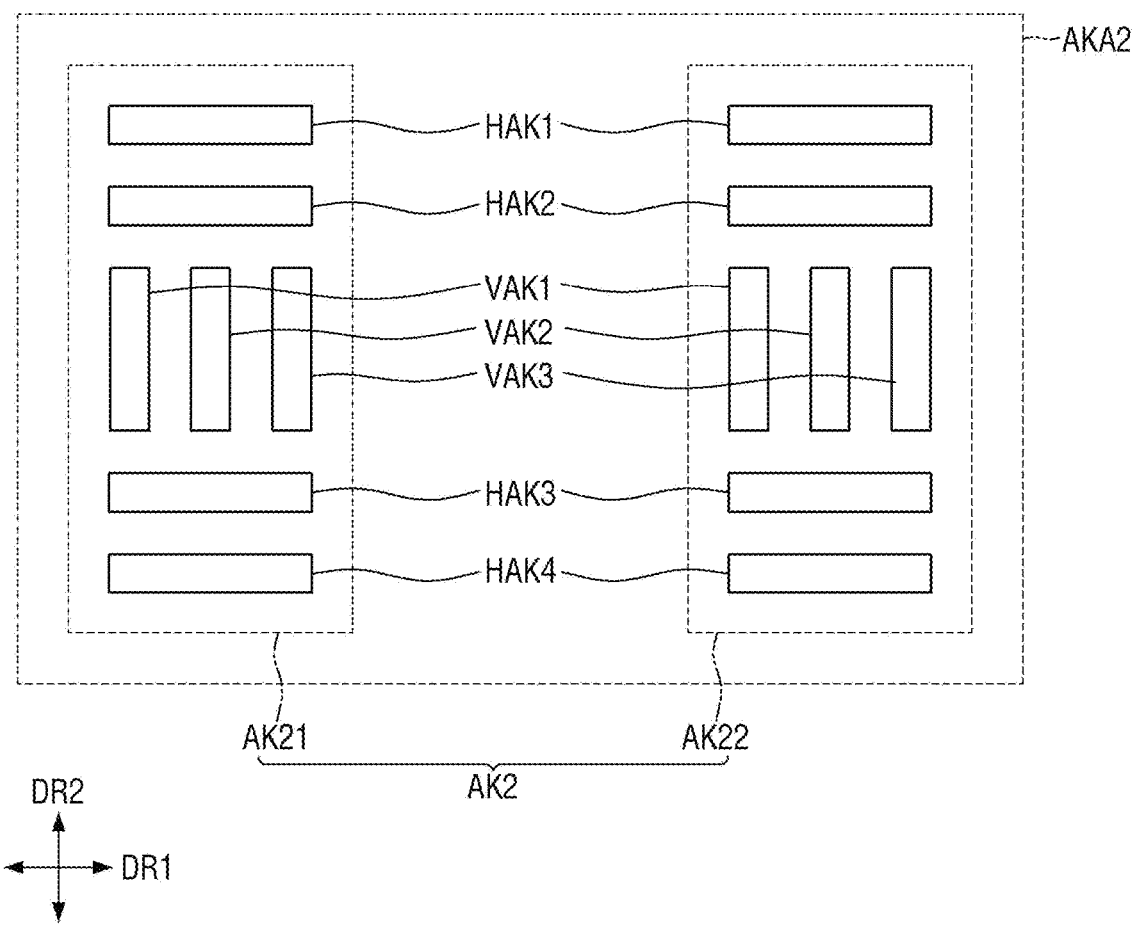
FIG. 5 is an example diagram showing one example of a second alignment mark in a second alignment mark region of FIG. 3.

FIG. 3 is one example diagram showing alignment of first alignment mark regions of a display panel and second alignment mark regions of a mask during the fabricating process of the display panel. FIG. 4 is an example diagram showing one example of a first alignment mark in a first alignment mark region of FIGS. 2 and 3. FIG. 5 is an example diagram showing one example of a second alignment mark in a second alignment mark region of FIG. 3.

Referring to FIGS. 3-5, a mask MASK is required to deposit a metal wire or a metal electrode, or to deposit an organic insulating layer or an inorganic insulating layer on the display panel 100 using a photolithography process. After placing a mask MASK having a suitable pattern (e.g., a predetermined pattern) on the display panel 100, the photolithography process may be performed to form a metal wire or a metal electrode, or to form an organic insulating layer or an inorganic insulating layer on the display panel.

At this time, the display panel 100 and the mask MASK are aligned using the first alignment marks AK1 of the first alignment mark regions AKA1 and second alignment marks AK2 of second alignment mark regions AKA2. Without aligning the display panel 100 and the mask MASK, it is not possible to form, at a desired position, a desired metal wire or metal electrode, as well as the organic insulating layer or the inorganic insulating layer.

For example, by checking, using a camera CCD, whether the first alignment mark AK1 in the first alignment mark region AKA1 of the display panel 100 and the second alignment mark AK2 in the second alignment mark region AKA2 of the mask MASK corresponding thereto are aligned, the display panel 100 and the mask MASK may be aligned. For example, the alignment between the first alignment mark AK1 in the first alignment mark region AKA1 located at a corner where the upper side and the left side of the display panel 100 meet, and the second alignment mark AK2 in the second alignment mark region AKA2 located at a corner where the upper side and the left side of the mask MASK meet, may be checked through the camera CCD. The alignment between the first alignment mark AK1 in the first alignment mark region AKA1 located at a corner where the upper side and the right side of the display panel 100 meet, and the second alignment mark AK2 in the second alignment mark region AKA2 located at a corner where the upper side and the right side of the mask MASK meet, may be checked through the camera CCD. The alignment between the first alignment mark AK1 in the first alignment mark region AKA1 located at a corner where the lower side and the left side of the display panel 100 meet, and the second alignment mark AK2 in the second alignment mark region AKA2 located at a corner where the lower side and the left side of the mask MASK meet, may be checked through the camera CCD. The alignment between the first alignment mark AK1 in the first alignment mark region AKA1 located at a corner where the lower side and the right side of the display panel 100 meet, and the second alignment mark AK2 in the second alignment mark region AKA2 located at a corner where the lower side and the right side of the mask MASK meet, may be checked through the camera CCD.

The first alignment mark AK1 may, as shown in (a) of FIG. 4, include horizontal alignment marks HAK1, HAK2, HAK3, and HAK4 and vertical alignment marks VAK1, VAK2, and VAK3. The horizontal alignment marks HAK1, HAK2, HAK3, and HAK4 may extend in the first direction DR1, and the vertical alignment marks VAK1, VAK2, and VAK3 may extend in the second direction DR2. The horizontal alignment marks HAK1, HAK2, HAK3, and HAK4 may be used to check the alignment in the first direction DR1, and the vertical alignment marks VAK1, VAK2, and VAK3 may be used to check the alignment in the second direction DR2. A first horizontal alignment mark HAK1 and a second horizontal alignment mark HAK2 may be located to the upper side of the vertical alignment marks VAK1, VAK2, and VAK3, and a third horizontal alignment mark HAK3 and a fourth horizontal alignment mark HAK4 may be located to the lower side of the vertical alignment marks VAK1, VAK2, and VAK3. The first horizontal alignment mark HAK1 may be located to the upper side of the second horizontal alignment mark HAK2, and the fourth horizontal alignment mark HAK4 may be located to the lower side of the third horizontal alignment mark HAK3.

Alternatively, as shown in (b) of FIG. 4, the first alignment mark AK1 may have a cross, a crisscross, or a plus (+) shape in a plan view. In this case, the first alignment mark AK1 may include a vertical alignment mark VAK1_1, a first horizontal alignment mark HAK1_1, and a second horizontal alignment mark HAK2_1. The vertical alignment mark VAK1_1 may extend in the second direction DR2, and the first horizontal alignment mark HAK1_1 and the second horizontal alignment mark HAK2_1 may extend in the first direction DR1. The first horizontal alignment mark HAK1_1 may protrude from the left side of the vertical alignment mark VAK1_1 in the first direction DR1, and the second horizontal alignment mark HAK2_1 may protrude from the right side of the vertical alignment mark VAK1_1 in the first direction DR1. Alternatively, as shown in (c) of FIG. 4, the first alignment mark AK1 may include a plurality of dot alignment marks DAK. The plurality of dot alignment marks DAK may be arranged in a plurality of columns C1, C2, and C3. The plurality of dot alignment marks DAK may be arranged along the second direction DR2 in each of the plurality of columns C1, C2, and C3.

As shown in FIG. 5, the second alignment mark AK2 may include a first mask alignment mark AK21 and a second mask alignment mark AK22. The first mask alignment mark AK21 and the second mask alignment mark AK22 may be spaced from each other in the first direction DR1. When checking the alignment between the first alignment mark AK1 and the second alignment mark AK2 through the camera CCD, the first alignment mark AK1 may be located between the first mask alignment mark AK21 and the second mask alignment mark AK22 in the first direction DR1.

Each of the first mask alignment mark AK21 and the second mask alignment mark AK22 may be substantially the same as the first alignment mark AK1 described in connection with (a) of FIG. 4. That is, each of the first mask alignment mark AK21 and the second mask alignment mark AK22 may include horizontal alignment marks HAK1, HAK2, HAK3, and HAK4 and vertical alignment marks VAK1, VAK2, and VAK3. In this case, the horizontal alignment marks HAK1, HAK2, HAK3, and HAK4 and the vertical alignment marks VAK1, VAK2, and VAK3 of the first alignment mark AK1, the horizontal alignment marks HAK1, HAK2, HAK3, and HAK4 and the vertical alignment marks VAK1, VAK2, and VAK3 of the first mask alignment mark AK21, and the horizontal alignment marks HAK1, HAK2, HAK3, and HAK4 and the vertical alignment marks VAK1, VAK2, and VAK3 of the second mask alignment mark AK22 may be arranged along the first direction. Therefore, whether the display panel 100 and the mask MASK are aligned may be confirmed by checking whether the horizontal alignment marks HAK1, HAK2, HAK3, and HAK4 and the vertical alignment marks VAK1, VAK2, and VAK3 of the first alignment mark AK1, the horizontal alignment marks HAK1, HAK2, HAK3, and HAK4 and the vertical alignment marks VAK1, VAK2, and VAK3 of the first mask alignment mark AK21, and the horizontal alignment marks HAK1, HAK2, HAK3, and HAK4 and the vertical alignment marks VAK1, VAK2, and VAK3 of the second mask alignment mark AK22 have been aligned in the first direction DR1.

Figure 6:
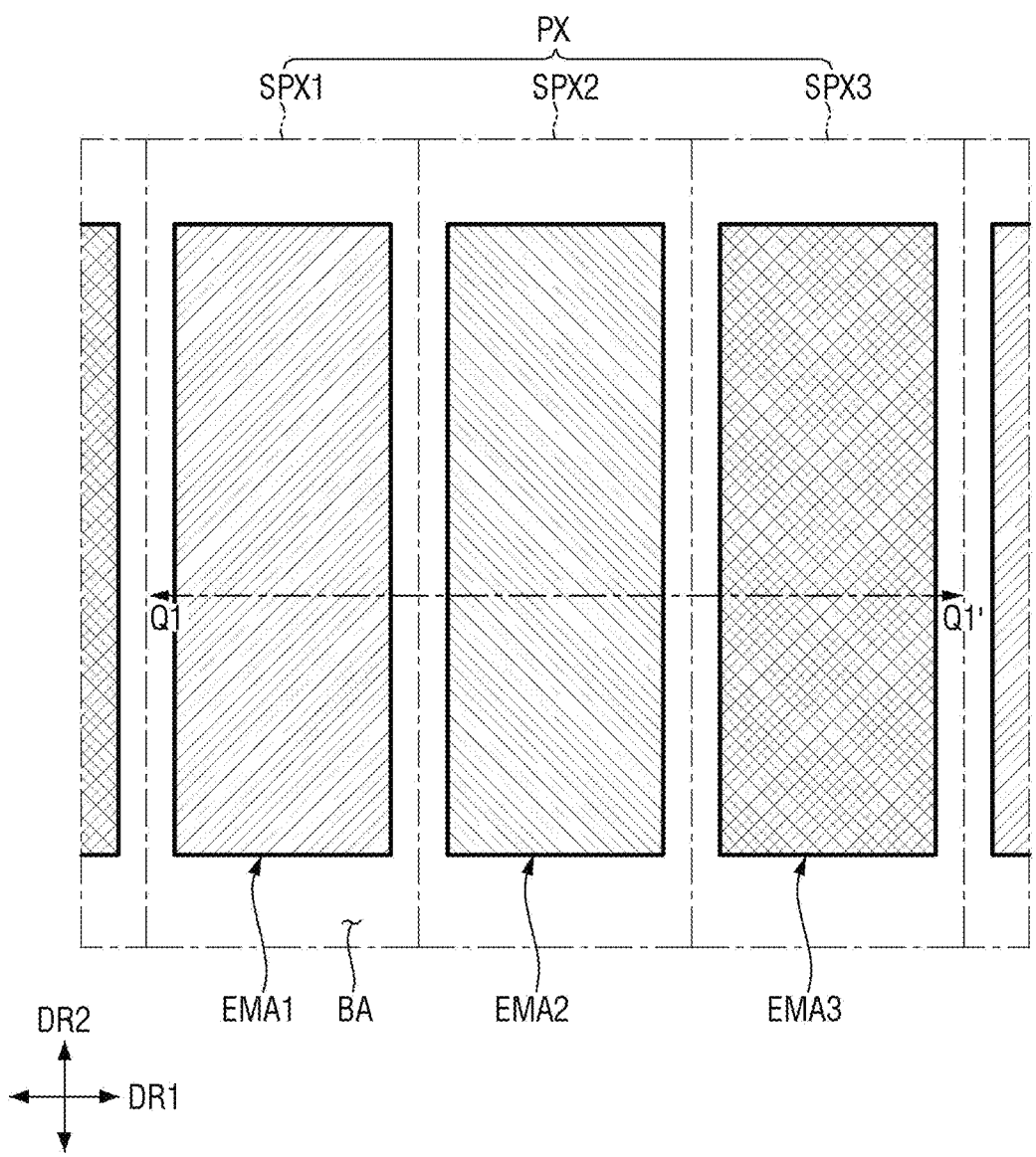
FIG. 6 is a layout diagram illustrating sub-pixels according to some embodiments.
Figure 7:
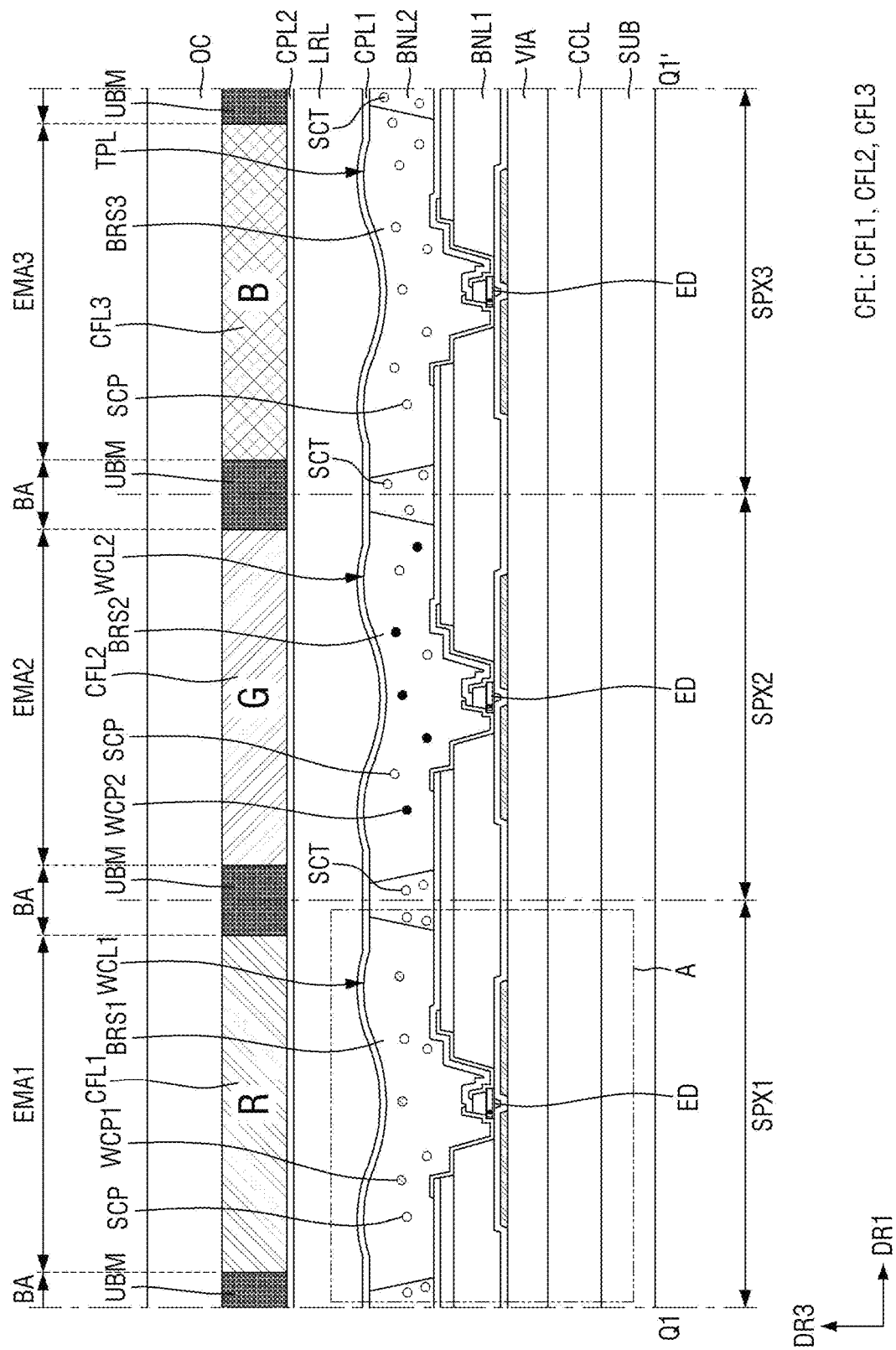
FIG. 7 is a cross-sectional view illustrating one example of a display panel taken along the line Q1-Q1' of FIG. 6.
Figure 8:
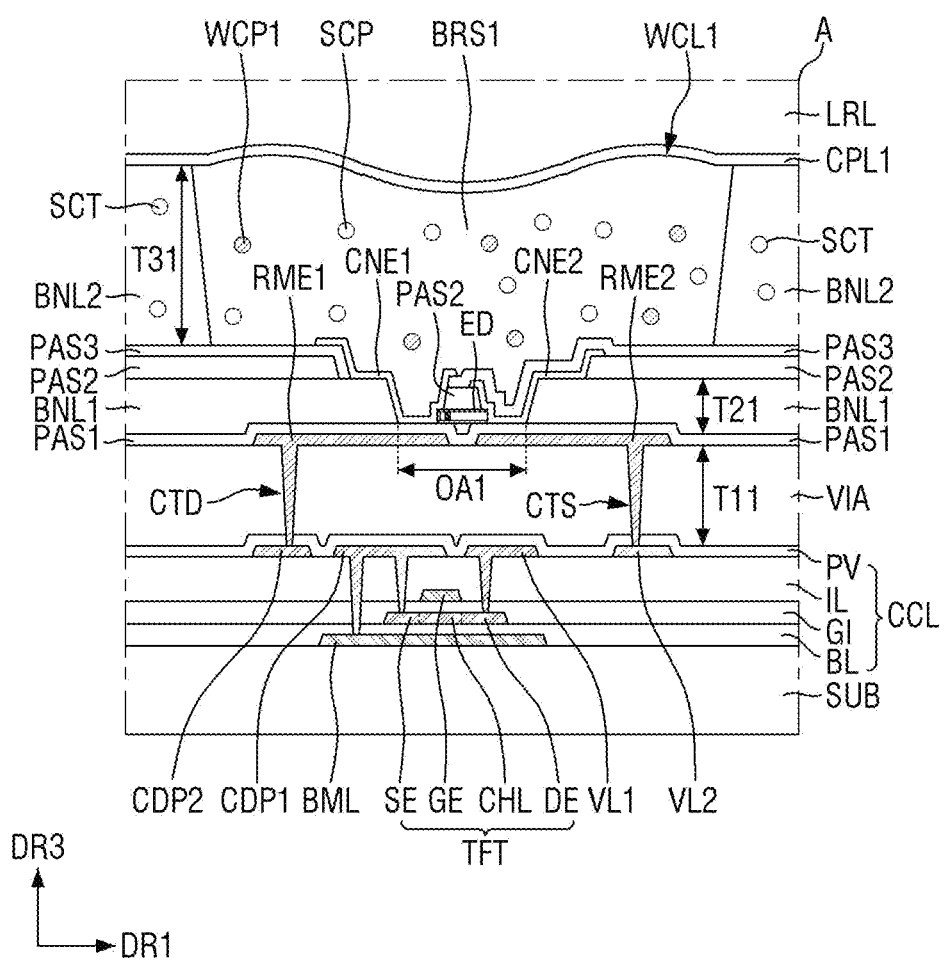
FIG. 8 is a cross-sectional view showing an area A of FIG. 7 in detail.

FIG. 6 is a layout diagram illustrating sub-pixels according to some embodiments. FIG. 7 is a cross-sectional view illustrating one example of a display panel taken along the line Q1-Q1' of FIG. 6. FIG. 8 is a cross-sectional view showing an area A of FIG. 7 in detail.

Referring to FIGS. 6-8, each of the plurality of sub-pixels SPX1, SPX2, and SPX3 may include a light emitting portion and a light blocking portion. For example, the first sub-pixel SPX1 may include a first light emitting portion EMA1 and a light blocking portion BA, the second sub-pixel SPX2 may include a second light emitting portion EMA2 and a light blocking portion BA, and the third sub-pixel SPX3 may include a third light emitting portion EMA3 and a light blocking portion BA.

The first light emitting portion EMA1, the second light emitting portion EMA2, and the third light emitting portion EMA3 may emit light of the same color. In this case, the first sub-pixel SPX1 may convert light of a third color outputted from the first light emitting portion EMA1 into light of a first color and output it. The second sub-pixel SPX2 may convert light of the third color outputted from the second light emitting portion EMA2 into light of a second color and output it. The third sub-pixel SPX3 may output light of the third color outputted from the third light emitting portion EMA3 as it is.

Alternatively, the first light emitting portion EMA1, the second light emitting portion EMA2, and the third light emitting portion EMA3 may emit light of different colors. In this case, the first sub-pixel SPX1 may output light of the first color outputted from the first light emitting portion EMA1, the second sub-pixel SPX2 may output light of the second color outputted from the second light emitting portion EMA2, and the third sub-pixel SPX3 may output light of the third color outputted from the third light emitting portion EMA3.

In FIG. 6, the first light emitting portion EMA1, the second light emitting portion EMA2, and the third light emitting portion EMA3 are shown to have the same area, but the present disclosure is not limited thereto. The first light emitting portion EMA1, the second light emitting portion EMA2, and the third light emitting portion EMA3 may have different areas depending on a color of light or a wavelength band of light.

The display panel 100 may include a substrate SUB, a thin film transistor layer CCL, a planarization layer VIA, a light emitting element layer, a low refractive layer LRL, and color filters CFL.

The substrate SUB may be an insulating substrate. The substrate SUB may be formed of an insulating material such as glass, quartz, or a polymer resin. The substrate SUB may be a rigid substrate or a flexible substrate that can be bent, folded or rolled.

The thin film transistor layer CCL may be located on one surface of the substrate SUB. The thin film transistor layer CCL may include a light blocking layer BML, a barrier layer BL, a thin film transistor TFT, a gate insulating layer GI, an interlayer insulating layer IL, and a passivation layer PV.

The light blocking layer BML may be located on one surface of the substrate SUB. The light blocking layer BML may overlap a channel layer CHL of the thin film transistor TFT in a third direction DR3 (e.g., a thickness direction of the substrate SUB). The light blocking layer BML may include a material that blocks light, and may reduce or prevent external light from entering the channel layer CHL of the thin film transistor TFT. Accordingly, a leakage current may be reduced or prevented from flowing through the channel layer CHL of the thin film transistor TFT due to external light. The light blocking layer BML may be formed as a single layer or multiple layers made of any one of molybdenum (Mo), aluminum (Al), chromium (Cr), gold (Au), silver (Ag), titanium (Ti), nickel (Ni), neodymium (Nd), and copper (Cu), or an alloy thereof.

The barrier layer BL may be located on the light blocking layer BML. The barrier layer BL is a layer for protecting the thin film transistor TFT from moisture permeating through the substrate SUB that is susceptible to moisture permeation. The barrier layer BL may be formed as a plurality of inorganic layers that are alternately stacked. For example, the barrier layer BL may be formed as a multilayer in which inorganic layers including at least one of silicon oxide ($SiO_x$), silicon nitride ($SiN_x$) and silicon oxynitride ($SiO_xN_y$) are alternately stacked.

The channel layer CHL, a source electrode SE, and a drain electrode DE of the thin film transistor TFT may be located on the barrier layer BL. The channel layer CHL may overlap a gate electrode GE in the third direction DR3. The channel layer CHL may be formed of polycrystalline silicon, monocrystalline silicon, low-temperature polycrystalline silicon, amorphous silicon, or an oxide semiconductor. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like. The source electrode SE and the drain electrode DE may have conductivity by doping a silicon semiconductor or an oxide semiconductor with ions or impurities.

The gate insulating layer GI may be located on the channel layer CHL of the thin film transistor TFT. In FIG. 8, the gate insulating layer GI is shown to be located on the entire top surface of the barrier layer BL, and the channel layer CHL, the source electrode SE, and the drain electrode DE of the thin film transistor TFT, but is not limited thereto. The gate insulating layer GI may be located only between the channel layer CHL and the gate electrode GE of the thin film transistor TFT. The gate insulating layer GI may include an inorganic layer, e.g., silicon oxide ($SiO_x$), silicon nitride ($SiN_x$), or silicon oxynitride ($SiO_xN_y$).

The gate electrode GE of the thin film transistor TFT may be located on the gate insulating layer GI. The gate electrode GE may overlap the channel layer CHL in the third direction DR3. The gate electrode GE may be formed as a single layer or multiple layers made of any one of molybdenum (Mo), aluminum (Al), chromium (Cr), gold (Au), silver (Ag), titanium (Ti), nickel (Ni), neodymium (Nd), and copper (Cu), or an alloy thereof.

The interlayer insulating layer IL may be located on the gate electrode GE. The interlayer insulating layer IL may include an inorganic layer, e.g., silicon oxide ($SiO_x$), silicon nitride ($SiN_x$), or silicon oxynitride ($SiO_xN_y$).

A first pattern electrode CDP1, a second pattern electrode CDP2, a first power supply line VL1 to which a first power voltage is applied, and a second power supply line VL2 to which a second power voltage, which is different from the first power voltage, is applied may be located on the interlayer insulating layer IL. For example, the second power voltage may be lower than the first power voltage. The first pattern electrode CDP1, the second pattern electrode CDP2, the first power supply line VL1, and the second power supply line VL2 may be formed as a single layer or multiple layers made of any one of molybdenum (Mo), aluminum (Al), chromium (Cr), gold (Au), silver (Ag), titanium (Ti), nickel (Ni), neodymium (Nd), and copper (Cu), or an alloy thereof.

The first pattern electrode CDP1 may be connected to the source electrode SE of the thin film transistor TFT through a contact hole penetrating the interlayer insulating layer IL and the gate insulating layer GI. In addition, the first pattern electrode CDP1 may be connected to the light blocking layer BML through a contact hole penetrating the interlayer insulating layer IL, the gate insulating layer GI, and the barrier layer BL.

The second pattern electrode CDP2 may be electrically connected to the first pattern electrode CDP1. That is, in FIG. 8, it is illustrated that the first pattern electrode CDP1 and the second pattern electrode CDP2 are located apart from each other, but the first pattern electrode CDP1 and the second pattern electrode CDP2 may be connected to each other directly or through a different metal layer. In some embodiments, the first power supply line VL1 may be connected to the drain electrode DE of the thin film transistor TFT through a contact hole penetrating the interlayer insulating layer IL and the gate insulating layer GI.

The passivation layer PV and the planarization layer VIA may be located on the first pattern electrode CDP1, the second pattern electrode CDP2, the first power supply line VL1, and the second power supply line VL2. The planarization layer VIA may be formed of an organic layer such as acryl resin, epoxy resin, phenolic resin, polyamide resin, polyimide resin and the like.

The light emitting element layer may be located on the planarization layer VIA. The light emitting element layer may include a first electrode RME1, a second electrode RME2, a light emitting element ED, a first insulating layer PAS1, a second insulating layer PAS2, a third insulating layer PAS3, a first bank BNL1, a second bank BNL2, a first wavelength conversion layer WCL1, a second wavelength conversion layer WCL2, and a transparent insulating layer TPL.

The first electrode RME1 and the second electrode RME2 may be located on the planarization layer VIA. The first electrode RME1 may be connected to the second pattern electrode CDP2 through a contact hole CTD penetrating the planarization layer VIA and the passivation layer PV. Accordingly, the first electrode RME1 may be electrically connected to the source electrode SE of the thin film transistor TFT. The second electrode RME2 may be connected to the second power supply line VL2 through a contact hole CTS penetrating the planarization layer VIA and the passivation layer PV. Accordingly, the second power voltage of the second power supply line VL2 may be applied to the second electrode RME2.

The first electrode RME1 and the second electrode RME2 may include a conductive material having a high reflectance. For example, the first electrode RME1 and the second electrode RME2 may include a metal such as gold (Au), silver (Ag), copper (Cu), or aluminum (Al). For this reason, among light emitted from the light emitting element ED, light directed to the first electrode RME1 and the second electrode RME2 may be reflected from the first electrode RME1 and the second electrode RME2, and may travel upward from the light emitting element ED.

Alternatively, the first electrode RME1 and the second electrode RME2 may further include a transparent conductive material. For example, the first electrode RME1 and the second electrode RME2 may include transparent conductive oxide such as ITO, IZO, and ITZO. In this case, the first and second electrodes RME1 and RME2 may have a stacked structure of ITO/Ag/ITO, ITO/Ag/IZO, ITO/Ag/ITZO/IZO, or the like.

The first insulating layer PAS1 may be located on the first electrode RME1 and the second electrode RME2. The first insulating layer PAS1 may be an insulating layer for preventing the light emitting element ED from being in direct contact with the first electrode RME1 and the second electrode RME2. The first insulating layer PAS1 may include an inorganic layer, e.g., silicon oxide ($SiO_x$), silicon nitride ($SiN_x$), or silicon oxynitride ($SiO_xN_y$).

The first bank BNL1 may be located on the first insulating layer PAS1. The first bank BNL1 may partition a region in which the light emitting element ED is located. That is, the light emitting element ED may be located in an opening area OA1 partitioned by the first bank BNL1. The first bank BNL1 may not be located in the opening area OA1. The first bank BNL1 may be formed of an organic layer such as acryl resin, epoxy resin, phenolic resin, polyamide resin, polyimide resin and the like.

The light emitting element ED may be located on the first insulating layer PAS1 in the opening area OA1 of the first bank BNL1. One end of the light emitting element ED may overlap a part of the first electrode RME1 in the third direction DR3, and the other end thereof may overlap a part of the second electrode RME2 in the third direction DR3. A detailed description of the light emitting element ED will be made later with reference to FIG. 9.

The second insulating layer PAS2 may be located on the light emitting element ED and the first bank BNL1. The second insulating layer PAS2 located on the light emitting element ED and the second insulating layer PAS2 located on the first bank BNL1 may be spaced from each other. The second insulating layer PAS2 may include an inorganic layer, e.g., silicon oxide ($SiO_x$), silicon nitride ($SiN_x$), or silicon oxynitride ($SiO_xN_y$).

A first connection electrode CNE1 may be connected to one end of the light emitting element ED, and a second connection electrode CNE2 may be connected to the other end of the light emitting element ED. The first connection electrode CNE1 may be connected to the first electrode RME1 through a contact hole penetrating the first insulating layer PAS1. In addition, the second connection electrode CNE2 may be connected to the second electrode RME2 through a contact hole penetrating the first insulating layer PAS1. Therefore, a driving current flowing through the channel layer CHL of the thin film transistor TFT according to the data voltage applied to the gate electrode of the thin film transistor TFT may flow to the second power supply line VL2 through the first electrode RME1, the first connection electrode CNE1, the light emitting element ED, the second connection electrode CNE2, and the second electrode RME2.

The third insulating layer PAS3 may be located on the second insulating layer PAS2 and the second connection electrode CNE2. The third insulating layer PAS3 may be an insulating layer for preventing the first connection electrode CNE1 and the second connection electrode CNE2 from being in contact with each other. Accordingly, the first connection electrode CNE1 may be located on the third insulating layer PAS3, while the second connection electrode CNE2 may be located under the third insulating layer PAS3. The third insulating layer PAS3 may include an inorganic layer, e.g., silicon oxide ($SiO_x$), silicon nitride ($SiN_x$), or silicon oxynitride ($SiO_xN_y$).

The second bank BNL2 may be located on the third insulating layer PAS3. The second bank BNL2 serves to partition a region in which the first wavelength conversion layer WCL1, the second wavelength conversion layer WCL2, and the transparent insulating layer TPL are located.

The second bank BNL2 may include scattering particles SCT. The scattering particles SCT may serve to scatter incident light. The scattering particles SCT may be metal oxide particles. The metal oxide may be silicon oxide ($SiO_2$), titanium oxide ($TiO_2$), zirconium oxide ($ZrO_2$), aluminum oxide ($Al_2O_3$), zinc oxide (ZnO), barium sulfate ($SO_4$), indium oxide ($In_2O_3$), or tin oxide ($SnO_2$).

Because light traveling from the first wavelength conversion layer WCL1 to the second bank BNL2 may proceed upward or may enter the first wavelength conversion layer WCL1 due to the scattering particles SCT of the second bank BNL2, the light emission efficiency of the first sub-pixel SPX1 may increase. In addition, because light traveling from the second wavelength conversion layer WCL2 to the second bank BNL2 may proceed upward or may enter the second wavelength conversion layer WCL2 due to the scattering particles SCT of the second bank BNL2, the light emission efficiency of the second sub-pixel SPX2 may increase. Because light traveling from the transparent insulating layer TPL to the second bank BNL2 may proceed upward or may enter the transparent insulating layer TPL due to the scattering particles SCT of the second bank BNL2, the light emission efficiency of the third sub-pixel SPX3 may increase.

In addition, the light transmittance of the second bank BNL2 may be low due to the scattering particles SCT. Therefore, it is possible to reduce the occurrence of color mixture which is caused by the light emitted from the light emitting element ED of one sub-pixel traveling to the color filter of the sub-pixel adjacent thereto.

The first wavelength conversion layer WCL1, the second wavelength conversion layer WCL2, and the transparent insulating layer TPL may be located above the light emitting element ED. The first wavelength conversion layer WCL1, the second wavelength conversion layer WCL2, and the transparent insulating layer TPL may be located in a region surrounded by the second bank BNL2.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may convert the wavelength of the blue light of the third color incident from the light emitting element ED.

The transparent insulating layer TPL may include a third base resin BRS3. The transparent insulating layer TPL transmits light of the third color emitted from the light emitting element ED while maintaining its wavelength. Scatterers SCP of the transparent insulating layer TPL may serve to control a transmission path of light transmitted through the transparent insulating layer TPL. The transparent insulating layer TPL may not include a wavelength conversion material.

Each of the first wavelength conversion layer WCL1, the second wavelength conversion layer WCL2, and the transparent insulating layer TPL may further include the scatterers SCP. The scatterers SCP may increase the wavelength conversion efficiency. The scatterers SCP may be metal oxide particles or organic particles. The metal oxide may be silicon oxide ($SiO_2$), titanium oxide ($TiO_2$), zirconium oxide ($ZrO_2$), aluminum oxide ($Al_2O_3$), zinc oxide (ZnO), barium sulfate ($BaSO_4$), indium oxide ($In_2O_3$), or tin oxide ($SnO_2$). The organic particles may be formed of an acrylic resin or a urethane resin.

The first to third base resins BRS1, BRS2, and BRS3 may include an organic material capable of transmitting light. For example, the first to third base resins BRS1, BRS2, and BRS3 may include an epoxy resin, an acrylic resin, a cardo resin, an imide resin, or the like. The first to third base resins BRS1, BRS2 and BRS3 may be formed of the same material, but the present disclosure is not limited thereto.

The first wavelength conversion material WCP1 may be a material that converts light of the third color emitted from the light emitting element ED into light of the first color, and the second wavelength conversion material WCP2 may be a material that converts light of the third color emitted from the light emitting element ED into light of the second color. The first color may be red, the second color may be green, and the third color may be blue, but they are not limited thereto. The first wavelength conversion material WCP1 and the second wavelength conversion material WCP2 may be quantum dots, quantum bars, phosphors or the like. Examples of the quantum dot may include Group IV nanocrystal, Group II-VI compound nanocrystal, Group III-V compound nanocrystal, and Group IV-VI nanocrystal, and a combination thereof.

In summary, light of the third color emitted from the light emitting element ED of the first sub-pixel SPX1 is incident on the first wavelength conversion layer WCL1, light of the third color emitted from the light emitting element ED of the second sub-pixel SPX2 is incident on the second wavelength conversion layer WCL2, and light of the third color emitted from the light emitting element ED of the third sub-pixel SPX3 is incident on the transparent insulating layer TPL. The light of the third color incident on the first wavelength conversion layer WCL1 may be converted to light of the first color, the light of the third color incident on the second wavelength conversion layer WCL2 may be converted to light of the second color, and the light of the third color incident on the transparent insulating layer TPL may be transmitted as it is without wavelength conversion. That is, even if the first sub-pixel SPX1, the second sub-pixel SPX2, and the third sub-pixel SPX3 include the light emitting elements ED that emit light of the same color, they may emit light of different colors through the first wavelength conversion layer WCL1, the second wavelength conversion layer WCL2, and the transparent insulating layer TPL.

An encapsulation structure including a plurality of layers may be located on the first wavelength conversion layer WCL1, the second wavelength conversion layer WCL2, and the transparent insulating layer TPL. For example, the encapsulation structure may include a first capping layer CPL1, a second capping layer CPL2, and the low refractive layer LRL located between the first capping layer CPL1 and the second capping layer CPL2.

The first capping layer CPL1 may be located on the first wavelength conversion layer WCL1, the second wavelength conversion layer WCL2, the transparent insulating layer TPL, and the second bank BNL2. The first capping layer CPL1 may reduce or prevent impurities such as moisture or air from permeating from the outside to damage or contaminate the first wavelength conversion layer WCL1, the second wavelength conversion layer WCL2, and the transparent insulating layer TPL. The first capping layer CPL1 may include an inorganic layer, e.g., silicon oxide ($SiO_x$), silicon nitride ($SiN_x$), or silicon oxynitride ($SiO_xN_y$).

The low refractive layer LRL is located on the first capping layer CPL1. The low refractive layer LRL is an optical layer that recycles light that has passed through the first wavelength conversion layer WCL1, the second wavelength conversion layer WCL2, and the transparent insulating layer TPL, and may improve the light emission efficiency and color purity of the display device 10. To this end, the low refractive layer LRL may include an organic material having a low refractive index. In addition, the low refractive layer LRL may flatten a stepped portion formed by the first wavelength conversion layer WCL1, the second wavelength conversion layer WCL2, the transparent insulating layer TPL, and the second bank BNL2.

The second capping layer CPL2 is located on the low refractive layer LRL. The second capping layer CPL2 may reduce or prevent impurities such as moisture or air from permeating from the outside to damage or contaminate the low refractive layer LRL. The second capping layer CPL2 may include an inorganic layer, e.g., silicon oxide ($SiO_x$), silicon nitride ($SiN_x$), or silicon oxynitride ($SiO_xN_y$).

The color filters CFL and an upper light absorbing member UBM may be located on the second capping layer CPL2. The color filters CFL may include a first color filter CFL1, a second color filter CFL2, and a third color filter CFL3.

The first color filter CFL1 may overlap the first wavelength conversion layer WCL1 in the third direction DR3. The first color filter CFL1 may transmit light of the first color, for example, red light. Therefore, among the light of the third color emitted from the light emitting element ED of the first sub-pixel SPX1, light of the first color converted by the first wavelength conversion layer WCL1 may pass through the first color filter CFL1. However, the light of the third color that has not been converted by the first wavelength conversion layer WCL1 may not pass through the first color filter CFL1.

The second color filter CFL2 may overlap the second wavelength conversion layer WCL2 in the third direction DR3. The second color filter CFL2 may transmit light of the second color, for example, green light. Therefore, among the light of the third color emitted from the light emitting element ED of the second sub-pixel SPX2, light of the second color converted by the second wavelength conversion layer WCL2 may pass through the second color filter CFL2. However, the light of the third color that has not been converted by the second wavelength conversion layer WCL2 may not pass through the second color filter CFL2.

The third color filter CFL3 may overlap the transparent insulating layer TPL in the third direction DR3. The third color filter CFL3 may transmit light of the third color, for example, blue light. Therefore, the light of the third color emitted from the light emitting element ED of the third sub-pixel SPX3 may pass through the third color filter CFL3.

The upper light absorbing member UBM may be located in the light blocking portions BA of the first sub-pixel SPX1, the second sub-pixel SPX2, and the third sub-pixel SPX3. The upper light absorbing member UBM may overlap the second bank BNL2 in the third direction DR3. The upper light absorbing member UBM may be located to be around (e.g., surround) each of the first color filter CFL1, the second color filter CFL2, and the third color filter CFL3. The upper light absorbing member UBM may include a light blocking material capable of blocking light. In this case, a black matrix may contain an inorganic black pigment such as carbon black or the like, or may contain an organic black pigment.

An overcoat layer OC may be located on the color filters CFL and the upper light absorbing member UBM. The overcoat layer OC may flatten a stepped portion formed by the color filters CFL and the upper light absorbing member UBM. The overcoat layer OC may be formed of an organic layer such as acryl resin, epoxy resin, phenolic resin, polyamide resin, polyimide resin and the like.

Figure 9:
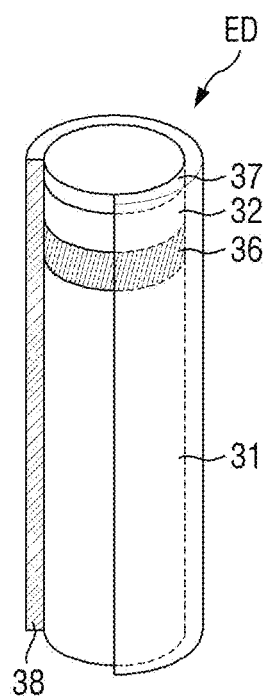
FIG. 9 is an example diagram showing one example of the light emitting element of FIGS. 7 and 8.

FIG. 9 is an example diagram showing one example of the light emitting element of FIGS. 7 and 8.

Referring to FIG. 9, the light emitting element ED may be a light emitting diode. The light emitting element ED may be an inorganic light emitting diode made of an inorganic material and having a size of nano-meter to micro-meter. The light emitting element ED may have a polarity (e.g., a predetermined polarity) when an electric field is formed in a specific direction between two electrodes opposite each other. Accordingly, the light emitting element ED may be aligned between two electrodes opposite each other.

The light emitting element ED may have a shape extending in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band when receiving an electrical signal applied from an external power source.

The light emitting element ED may include a first semiconductor layer 31, a second semiconductor layer 32, a light emitting layer 36, an electrode layer 37 and an insulating layer 38.

FIG. 9 illustrates a state in which the insulating layer 38 is partially removed to show the components of the light emitting element ED, so that the first semiconductor layer 31, the second semiconductor layer 32, the light emitting layer 36, and the electrode layer 37 are exposed. However, the insulating layer 38 may be located to surround some of the outer surfaces (e.g., outer peripheral surfaces) of the first semiconductor layer 31, the second semiconductor layer 32, the light emitting layer 36, and the electrode layer 37.

The first semiconductor layer 31 may be an n-type semiconductor. For example, when the light emitting element ED emits light of a blue wavelength band, the first semiconductor layer 31 may include a semiconductor material having a chemical formula of $Al_xGa_yIn_{1-x-y}N$ ($0 \leq x \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant. For example, the n-type dopant may be Si, Ge, Sn, or the like. In some embodiments, the first semiconductor layer 31 may be n-GaN doped with n-type Si. The length of the first semiconductor layer 31 may have a range of about 1.5 µm to about 5 µm, but is not limited thereto.

The second semiconductor layer 32 is located on the light emitting layer 36 to be described later. The second semiconductor layer 32 may be a p-type semiconductor. For example, when the light emitting element ED emits light of a blue or green wavelength band, the second semiconductor layer 32 may include a semiconductor material having a chemical formula of AlxGayIn1-x-yN (0≤x≤1, 0≤y≤1, 0≤x≤1). For example, it may be any one or more of p-type doped AlGaInN, GaN, AlGaN, InGaN, AlN and InN. The second semiconductor layer 32 may be doped with a p-type dopant. For example, the p-type dopant may be Mg, Zn, Ca, Se, Ba, or the like. In some embodiments, the second semiconductor layer 32 may be p-GaN doped with p-type Mg. The length of the second semiconductor layer 32 may have a range of about 0.05 μm to about 0.10 μm, but is not limited thereto.

Although FIG. 9 illustrates that each of the first semiconductor layer 31 and the second semiconductor layer 32 are formed as one layer, the embodiments of this specification are not limited thereto. For example, the first semiconductor layer 31 and the second semiconductor layer 32 may further include a larger number of layers (e.g., a cladding layer or a tensile strain barrier reducing (TSBR) layer), depending on the material of the light emitting layer 36.

The light emitting layer 36 is located between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. For example, when the light emitting layer 36 emits light of a blue wavelength band, a material such as AlGaN or AlGaInN may be included. In particular, when the light emitting layer 36 has a structure in which quantum layers and well layers are alternately stacked in a multiple quantum well structure, the quantum layer may include a material such as AlGaN or AlGaInN, and the well layer may include a material such as GaN or AlInN. In some embodiments, the light emitting layer 36 may include AlGaInN as a quantum layer and AlInN as a well layer, and the light emitting layer 36 may emit blue light having a central wavelength band of about 370 nm to about 490 nm.

However, the present disclosure is not limited thereto, and the light emitting layer 36 may have a structure in which semiconductor materials having large band gap energy and semiconductor materials having small band gap energy are alternately stacked, and may include other Group III-V semiconductor materials according to the wavelength band of the emitted light. The light emitted by the light emitting layer 36 is not limited to light of a blue wavelength band, and may be light of a red wavelength band or light of a green wavelength band. The length of the light emitting layer 36 may have a range of about 0.05 μm to about 0.10 μm, but is not limited thereto.

Light emitted from the light emitting layer 36 may be emitted to both side surfaces as well as the outer surface of the light emitting element ED in the longitudinal direction. The directionality of the light emitted from the light emitting layer 36 is not limited to one direction.

The electrode layer 37 may be located on the second semiconductor layer 32. The electrode layer 37 may be an Ohmic contact electrode. However, the electrode layer 37 is not limited thereto, and may be a Schottky contact electrode. The light emitting element ED may include at least one electrode layer 37. In FIG. 9, the light emitting element ED is shown to include one electrode layer 37, but it may include two or more electrode layers 37. Alternatively, the electrode layer 37 may be omitted from the light emitting element ED.

When one end of the light emitting element ED is brought into contact with the first connection electrode CNE1, the electrode layer 37 may reduce resistance between the light emitting element ED and the first connection electrode CNE1. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). Further, the electrode layer 37 may include an n-type or p-type doped semiconductor material. The length of the electrode layer 37 may have a range of about 0.05 μm to about 0.10 μm, but is not limited thereto.

The insulating layer 38 is located to surround the outer surfaces (e.g., outer peripheral surfaces) of the first semiconductor layer 31, the second semiconductor layer 32, the light emitting layer 36, and the electrode layer 37. The insulating layer 38 may function to protect the first semiconductor layer 31, the second semiconductor layer 32, the light emitting layer 36, and the electrode layer 37. In one example, the insulating layer 38 may be formed such that both ends thereof are exposed in the length direction of the light emitting element ED.

In FIG. 9, it is illustrated that the insulating layer 38 extends in a length direction of the light emitting element ED to cover it from the first semiconductor layer 31 to the electrode layer 37, but the present disclosure is not limited thereto. The insulating layer 38 may cover only the outer surface (e.g., outer peripheral surfaces) of the light emitting layer 36 and the outer surfaces (e.g., outer peripheral surfaces) of parts of the first and second semiconductor layers 31 and 32. Alternatively, the insulating layer 38 may cover a part of the outer surface (e.g., outer peripheral surface) of the electrode layer 37, so that the outer surface of the electrode layer 37 may be partially exposed without being covered by the insulating layer 38.

The thickness of the insulating layer 38 may have a range of about 10 nm to about 1.0 μm, but is not limited thereto. In some embodiments, the thickness of the insulating layer 38 may be around 40 nm.

The insulating layer 38 may include materials having insulating properties, for example, silicon oxide ($SiO_x$), silicon nitride ($SiN_x$), silicon oxynitride ($SiO_xN_y$), aluminum nitride (AlN), aluminum oxide ($A_2O_3$), and the like. Accordingly, an electrical short circuit that may be caused when the light emitting layer 36 is brought into direct contact with the first connection electrode CNE1 or the second connection electrode CNE2 may be prevented. In addition, because the insulating layer 38 covers the outer surface of the light emitting layer 36 to protect the outer surface (e.g., outer peripheral surfaces) of the light emitting element ED, it is possible to prevent degradation in light emission efficiency.

Further, the light emitting elements ED may be contained in a suitable coating solution (e.g., a predetermined coating solution) at the time of fabricating the display device 10. At this time, the surface of the insulating layer 38 may be subjected to hydrophobic treatment or hydrophilic treatment so that the light emitting element ED is separated from another light emitting element ED adjacent thereto without being aggregated in the coating solution.

The light emitting element ED may have a length of about 1 μm to about 10 μm, or about 2 μm to about 6 μm, or about 3 μm to about 5 μm. Further, a diameter of the light emitting element ED may have a range of about 30 nm to about 700 nm, and an aspect ratio of the light emitting element ED may be about 1.2 to about 100. However, the light emitting elements ED may have different diameters depending on the composition difference of the light emitting layer 36. In some embodiments, the diameter of the light emitting element ED may be about 500 nm.

Figure 10:
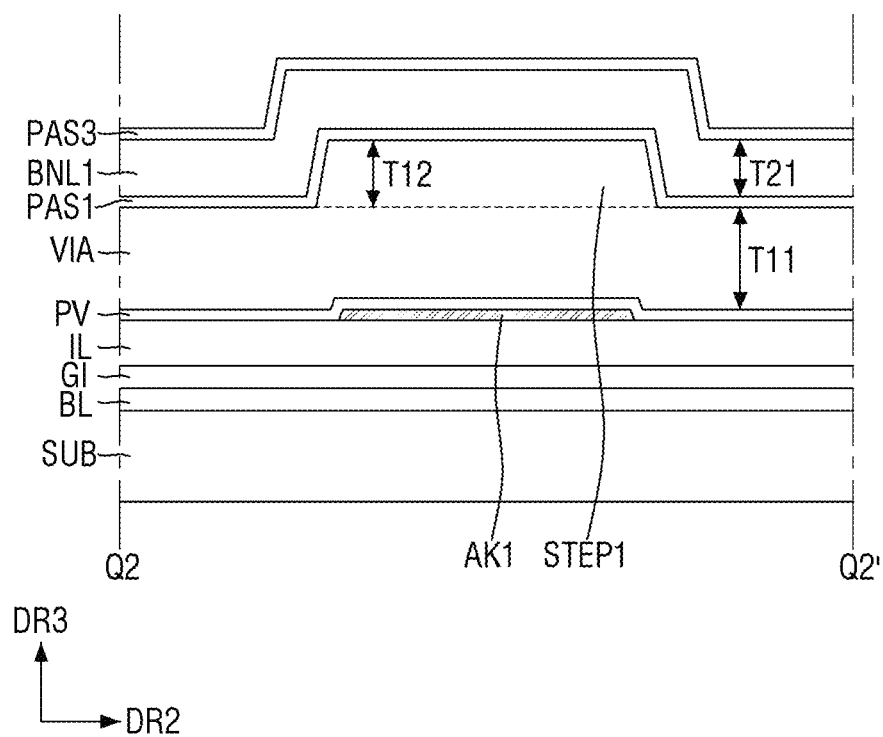
FIG. 10 is a cross-sectional view illustrating an example of a display panel taken along the line Q2-Q2' of (a) of FIG. 4.

FIG. 10 is a cross-sectional view illustrating an example of a display panel taken along the line Q2-Q2' of (a) of FIG. 4.

Referring to FIG. 10, the first alignment mark AK1 may be located on the interlayer insulating layer IL. That is, the first alignment mark AK1 may be located at the same layer and formed of the same material as the first pattern electrode CDP1, the second pattern electrode CDP2, the first power supply line VL1, and the second power supply line VL2.

The planarization layer VIA may include a first stepped portion STEP1 that overlaps the first alignment mark AK1 in the third direction DR3. The first stepped portion STEP1 may protrude in the third direction DR3 from the planarization layer VIA that overlaps the first alignment mark AK1 in the third direction DR3. The first stepped portion STEP1 may protrude from the top surface of the planarization layer VIA that overlaps the first alignment mark AK1 in the third direction DR3.

Due to the first stepped portion STEP1, a thickness T11+T12 of the planarization layer VIA that overlaps the first alignment mark AK1 in the third direction DR3 may be greater than a thickness T11 of the planarization layer VIA that does not overlap the first alignment mark AK1 in the third direction DR3. For example, as shown in FIGS. 8 and 10, the thickness T11+T12 of the planarization layer VIA that overlaps the first alignment mark AK1 in the third direction DR3 may be greater than the thickness T11 of the planarization layer VIA that overlaps the first electrode RME1 or the second electrode RME2 in the third direction DR3.

In addition, a thickness T12 of the first stepped portion STEP1 may be smaller than, or less than, the thickness T11 of the planarization layer VIA that does not overlap the first alignment mark AK1 in the third direction DR3. For example, the thickness T12 of the first stepped portion STEP1 may be smaller than the thickness T11 of the planarization layer VIA that overlaps the first electrode RME1 or the second electrode RME2 in the third direction DR3, but the present disclosure is not limited thereto.

On the other hand, to reduce the occurrence of color mixture due to the light emitted from the light emitting element ED of one sub-pixel and traveling to the color filter of its adjacent sub-pixel, the second bank BNL2 may include the scattering particles SCT, and accordingly, the light transmittance of the second bank BNL2 may be 15% or less. However, in this case, it is difficult to recognize the first alignment mark AK1 using the camera CCD as shown in FIG. 3.

However, due to the first stepped portion STEP1, the first insulating layer PAS1, the first bank BNL1, and the third insulating layer PAS3 located on the planarization layer VIA may be formed along the cross-sectional shape of the first stepped portion STEP1. Accordingly, when a bank material for forming the second bank BNL2 is formed on the third insulating layer PAS3 during the fabricating process, the thickness of the bank material that overlaps the first alignment mark AK1 in the third direction DR3 may be smaller than the thickness of the bank material that does not overlap the first alignment mark AK1 in the third direction DR3. Because the light transmittance of the bank material is inversely proportional to the thickness of the bank material, the light transmittance of the bank material that overlaps the first alignment mark AK1 in the third direction DR3 may be higher than the light transmittance of the bank material that does not overlap the first alignment mark AK1 in the third direction DR3. Accordingly, the first alignment mark AK1 may be recognized using the camera CCD as shown in FIG. 3. A detailed description of reducing the thickness of the bank material that overlaps the first alignment mark AK1 in the third direction DR3 due to the first stepped portion STEP1 will be made later with reference to FIGS. 26-28.

In FIG. 10, the second insulating layer PAS2 is omitted from the non-display area NDA, but the present disclosure is not limited thereto. When the second insulating layer PAS2 is not omitted in the non-display area NDA, it may be located between the first bank BNL1 and the third insulating layer PAS3.

Figure 11:
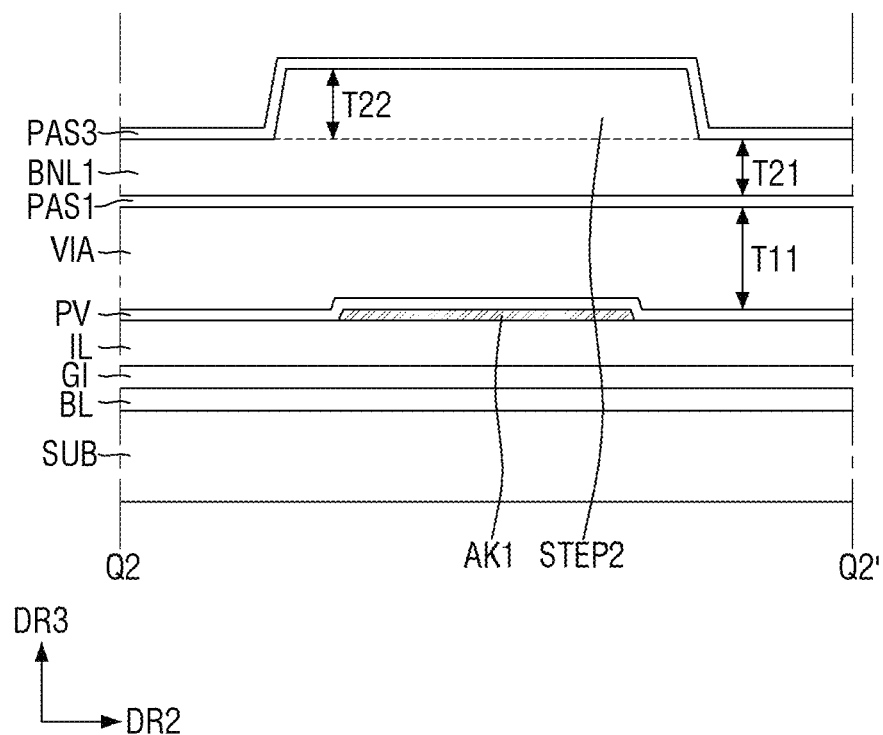
FIG. 11 is a cross-sectional view illustrating an example of a display panel taken along the line Q2-Q2' of (a) of FIG. 4.

FIG. 11 is a cross-sectional view illustrating an example of a display panel taken along the line Q2-Q2' of (a) of FIG. 4.

Embodiments corresponding to FIG. 11 differ from embodiments corresponding to FIG. 10 in that the first bank BNL1 includes a second stepped portion STEP2 instead of the first stepped portion STEP1 of the planarization layer VIA. In FIG. 11, the differences from embodiments corresponding to FIG. 10 will be mainly described.

Referring to FIG. 11, the first bank BNL1 may include the second stepped portion STEP2 that overlaps the first alignment mark AK1 in the third direction DR3. The second stepped portion STEP2 may protrude in the third direction DR3 from the first bank BNL1 that overlaps the first alignment mark AK1 in the third direction DR3. The second stepped portion STEP2 may protrude from the top surface of the first bank BNL1 that overlaps the first alignment mark AK1 in the third direction DR3.

Due to the second stepped portion STEP2, a thickness T21+T22 of the first bank BNL1 that overlaps the first alignment mark AK1 in the third direction DR3 may be greater than a thickness T21 of the first bank BNL1 that does not overlap the first alignment mark AK1 in the third direction DR3. For example, as shown in FIGS. 8 and 11, the thickness T21+T22 of the first bank BNL1 that overlaps the first alignment mark AK1 in the third direction DR3 may be greater than the thickness T21 of the first bank BNL1 that overlaps the first electrode RME1 or the second electrode RME2 in the third direction DR3.

In addition, a thickness T22 of the second stepped portion STEP2 may be smaller than the thickness T21 of the first bank BNL1 that does not overlap the first alignment mark AK1 in the third direction DR3. For example, the thickness T22 of the second stepped portion STEP2 may be smaller than the thickness T21 of the first bank BNL1 that overlaps the first electrode RME1 or the second electrode RME2 in the third direction DR3, but the present disclosure is not limited thereto.

Due to the second stepped portion STEP2, the third insulating layer PAS3 located on the first bank BNL1 may be formed along the cross-sectional shape of the second stepped portion STEP2. Accordingly, when the bank material for forming the second bank BNL2 is formed on the third insulating layer PAS3 during the fabricating process, the thickness of the bank material that overlaps the first alignment mark AK1 in the third direction DR3 may be smaller than the thickness of the bank material that does not overlap the first alignment mark AK1 in the third direction DR3. Because the light transmittance of the second bank BNL2 is inversely proportional to the thickness of the second bank BNL2, the light transmittance of the bank material that overlaps the first alignment mark AK1 in the third direction DR3 may increase. Accordingly, the first alignment mark AK1 may be recognized using the camera CCD as shown in FIG. 3.

Figure 12:
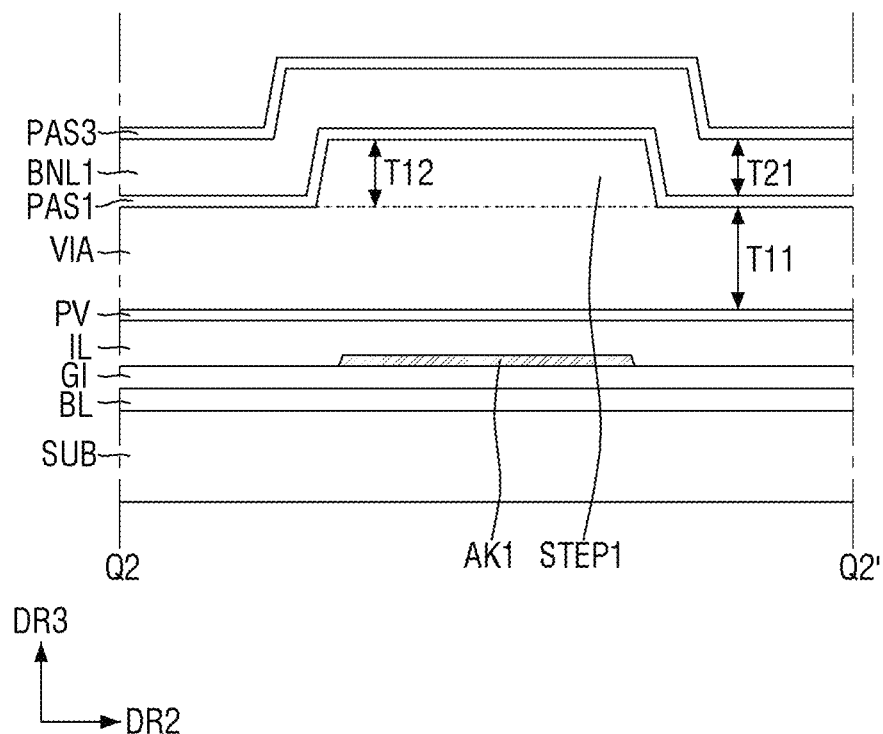
FIG. 12 is a cross-sectional view illustrating an example of a display panel taken along the line Q2-Q2' of (a) of FIG. 4.

FIG. 12 is a cross-sectional view illustrating still an example of a display panel taken along the line Q2-Q2' of (a) of FIG. 4.

Embodiments corresponding to FIG. 12 differs from embodiments corresponding to FIG. 10 only in that the first alignment mark AK1 is located on the gate insulating layer GI. That is, in FIG. 12, the first alignment mark AK1 may be located at the same layer and formed of the same material as the gate electrode GE of the thin film transistor TFT. Also in embodiments corresponding to FIG. 11, the first alignment mark AK1 may be located on the gate insulating layer GI.

Figure 13:
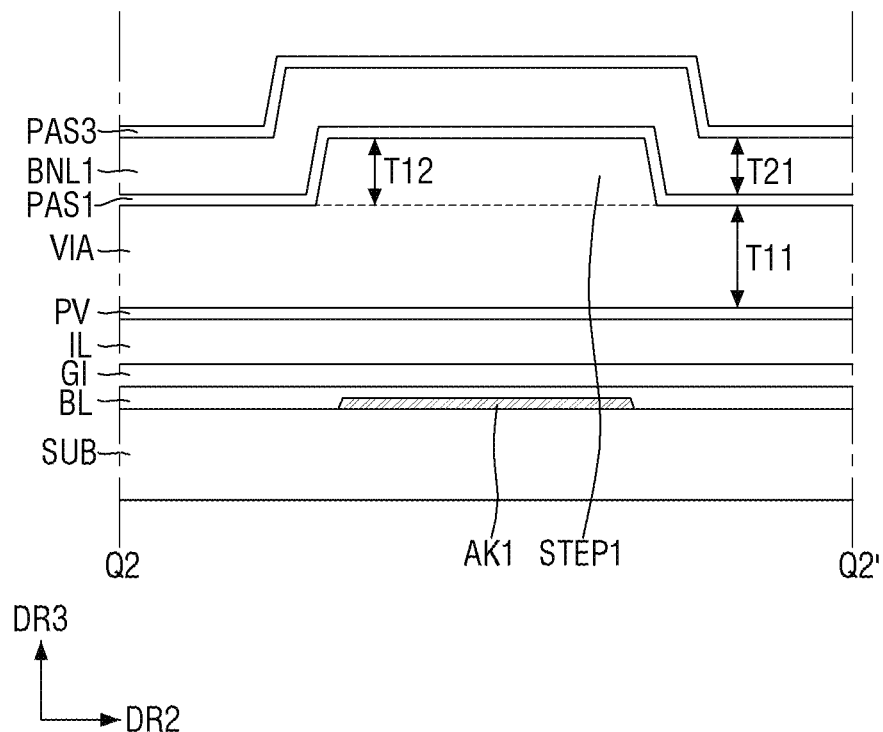
FIG. 13 is a cross-sectional view illustrating an example of a display panel taken along the line Q2-Q2' of (a) of FIG. 4.

FIG. 13 is a cross-sectional view illustrating still another example of a display panel taken along the line Q2-Q2' of (a) of FIG. 4.

Embodiments corresponding to FIG. 13 differs from embodiments corresponding to FIG. 10 only in that the first alignment mark AK1 is located on the substrate SUB (e.g., the first alignment mark AK1 may be located on the barrier layer BL above the substrate SUB). In other embodiments, the first alignment mark AK1 may be located at the same layer and formed of the same material as the light blocking layer BML. Also in embodiments corresponding to FIG. 11, the first alignment mark AK1 may be located on the substrate SUB (e.g., on the interlayer insulating layer IL above the substrate SUB).

Figure 14:
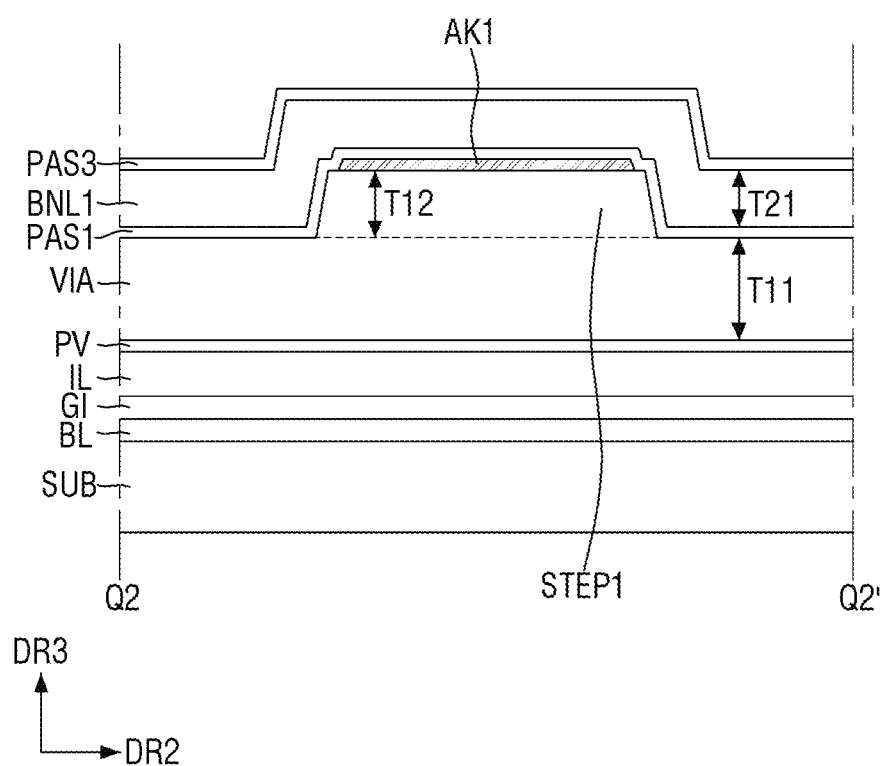
FIG. 14 is a cross-sectional view illustrating an example of a display panel taken along the line Q2-Q2' of (a) of FIG. 4.

FIG. 14 is a cross-sectional view illustrating an example of a display panel taken along the line Q2-Q2' of (a) of FIG. 4.

Embodiments corresponding to FIG. 14 differs from embodiments corresponding to FIG. 10 only in that the first alignment mark AK1 is located on the first stepped portion STEP1. That is, in FIG. 14, the first alignment mark AK1 may be located at the same layer and formed of the same material as the first electrode RME1 and the second electrode RME2. Also in embodiments corresponding to FIG. 11, the first alignment mark AK1 may be located on the planarization layer VIA. For example, the embodiment of FIG. 11 may be modified such that the first alignment mark AK1 is on the planarization layer VIA (see, for example, FIG. 14).

Figure 15:
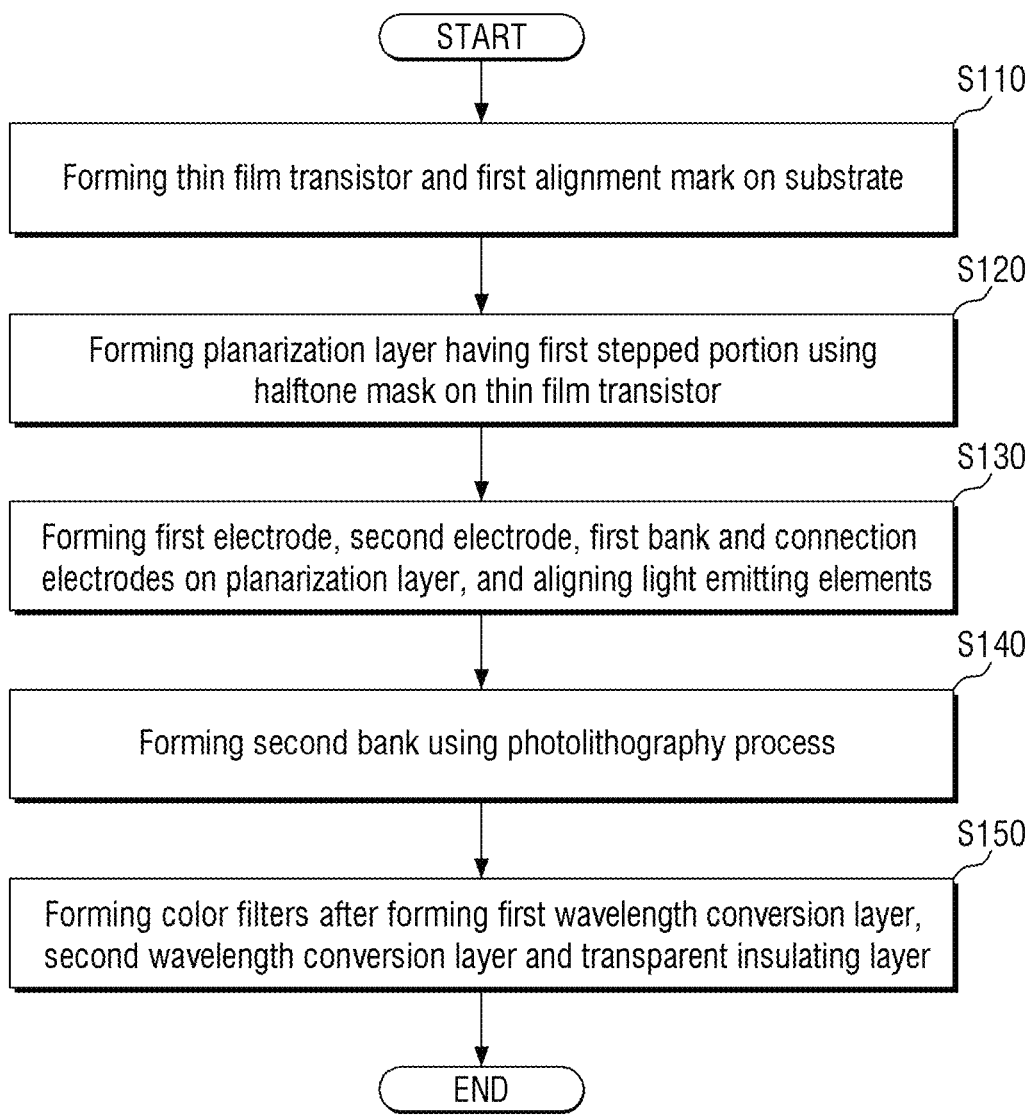
FIG. 15 is a flowchart illustrating a method for fabricating a display device according to some embodiments.

FIG. 15 is a flowchart illustrating a method for fabricating a display device according to some embodiments. FIGS. 16-25 are cross-sectional views illustrating a method for fabricating a display device according to some embodiments.

Hereinafter, a method for fabricating a display device according to some embodiments will be described in detail with reference to FIGS. 15-25.

Figure 16:
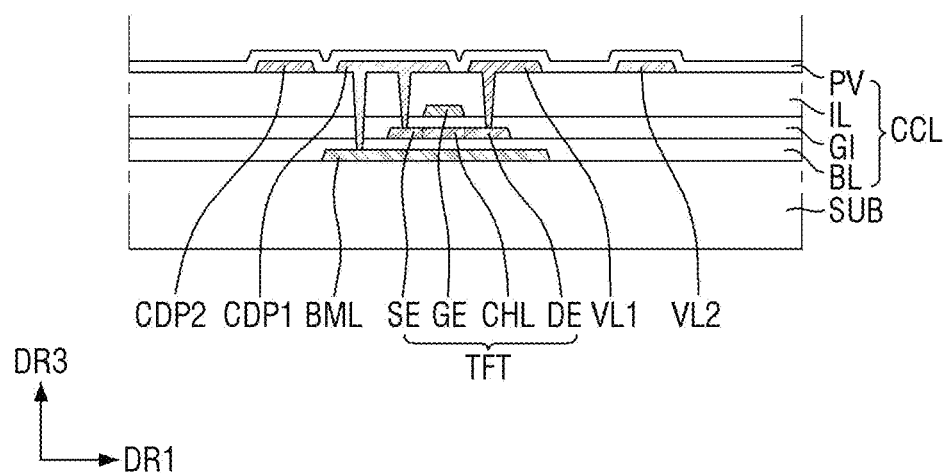
FIGS. 16-25 are cross-sectional views illustrating a method for fabricating a display device according to some embodiments.
Figure 17:
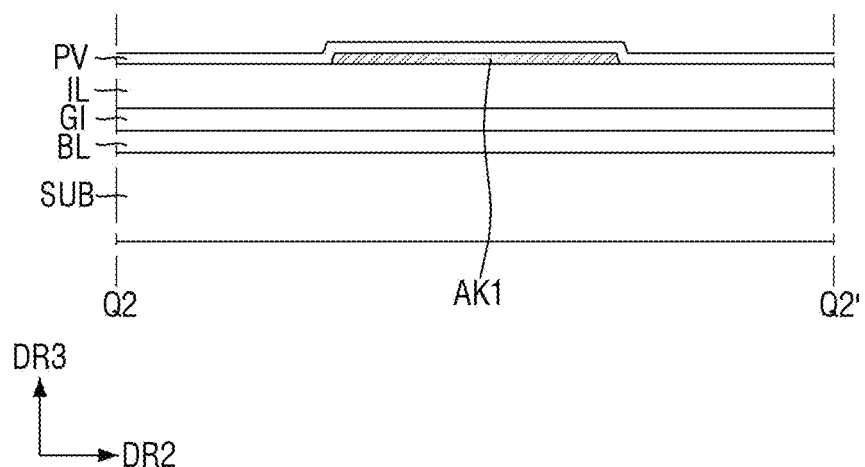

First, as shown in FIGS. 16 and 17, the thin film transistor TFT and the first alignment mark AK1 are formed on the substrate SUB (operation S110 in FIG. 15).

For example, the light blocking layer BML may be located on one surface of the substrate SUB. The barrier layer BL is formed on the substrate SUB and the light blocking layer BML by depositing an inorganic material on the substrate SUB.

Then, a semiconductor layer including the channel layer CHL, the source electrode SE, and the drain electrode DE of the thin film transistor TFT is formed on the barrier layer BL by using the photolithography process. The semiconductor layer may be polycrystalline silicon, monocrystalline silicon, low-temperature polycrystalline silicon, amorphous silicon, or an oxide semiconductor.

Subsequently, an inorganic material is deposited on the channel layer CHL, the source electrode SE, and the drain electrode DE of the thin film transistor TFT to form the gate insulating layer GI.

Then, the gate electrode GE of the thin film transistor TFT is formed on the gate insulating layer GI by using the photolithography process.

Thereafter, the source electrode SE and the drain electrode DE are doped with ions or impurities by using the gate electrode GE of the thin film transistor TFT as a mask. Accordingly, the source electrode SE and the drain electrode DE of the thin film transistor TFT may have conductivity.

Then, the interlayer insulating layer IL is formed by depositing an inorganic material on the gate electrode GE of the thin film transistor TFT.

Next, using the photolithography process, a contact hole exposing the source electrode SE of the thin film transistor TFT and a contact hole exposing the drain electrode DE of the thin film transistor TFT are formed by penetrating the gate insulating layer GI and the interlayer insulating layer IL. In addition, using the photolithography process, a contact hole may be formed to penetrate the barrier layer BL, the gate insulating layer GI, and the interlayer insulating layer IL to expose the light blocking layer BML.

Then, the first pattern electrode CDP1, the second pattern electrode CDP2, the first power supply line VL1, the second power supply line VL2, and the first alignment mark AK1 are formed on the interlayer insulating layer IL, using the photolithography process. The first pattern electrode CDP1 may be connected to the source electrode SE of the thin film transistor TFT through one contact hole, and may be connected to the light blocking layer BML through another contact hole. In some embodiments, the first power supply line VL1 may be connected to the drain electrode DE of the thin film transistor TFT through a contact hole penetrating the interlayer insulating layer IL and the gate insulating layer GI.

Then, an inorganic material is deposited on the first pattern electrode CDP1, the second pattern electrode CDP2, the first power supply line VL1, the second power supply line VL2, and the first alignment mark AK1 to form the passivation layer PV (e.g., see FIG. 17).

In some embodiments, the first alignment mark AK1 may be located on the gate insulating layer GI or the substrate SUB, not on the interlayer insulating layer IL. Alternatively, the first alignment mark AK1 may be located on the planarization layer VIA.

Figure 18:
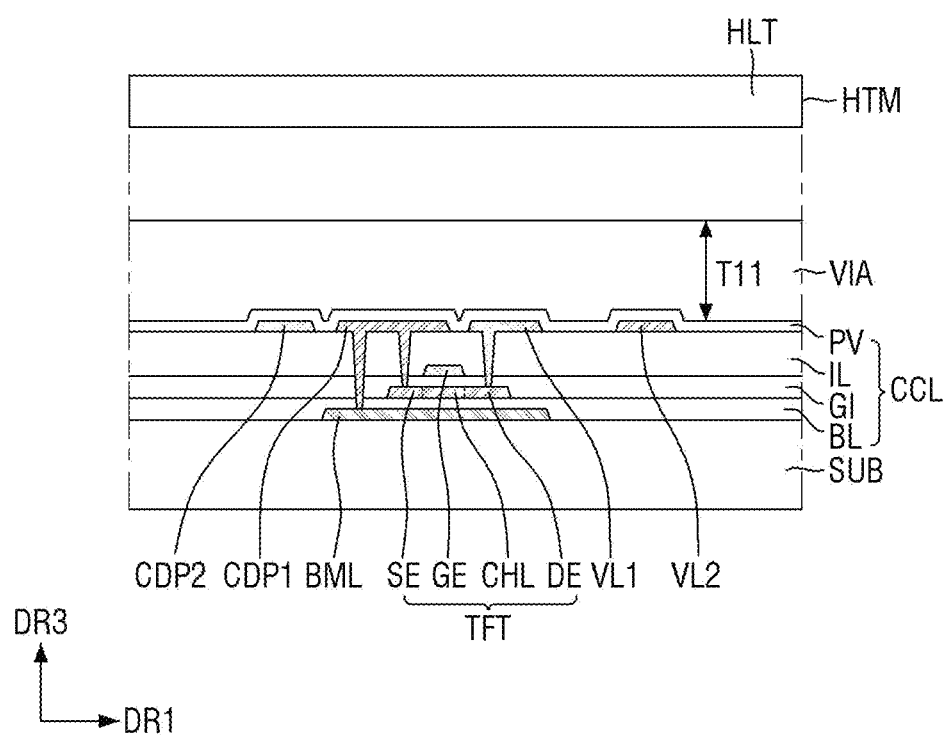
Figure 19:
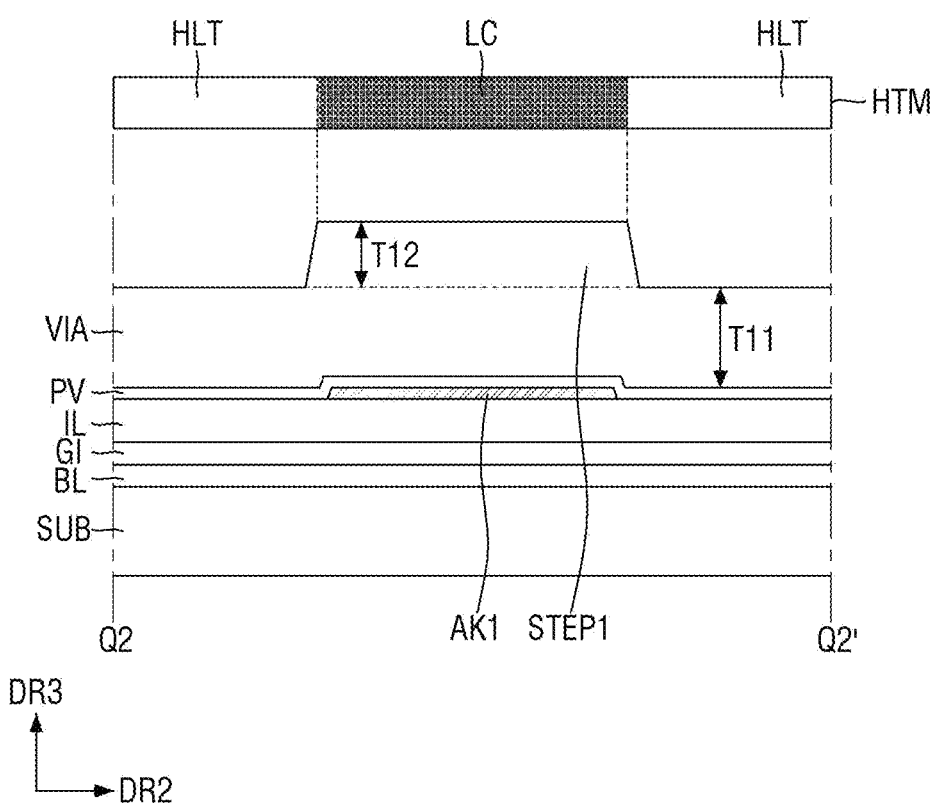

Second, as shown in FIGS. 18 and 19, the planarization layer VIA having the first stepped portion STEP1 is formed using a first mask HTM (e.g., a halftone mask) (operation S120 in FIG. 15).

In FIGS. 18 and 19, the planarization layer VIA is illustrated as a positive photoresist in which a portion irradiated with light is removed during development, but is not limited thereto. The planarization layer VIA may be a negative photoresist in which a portion not irradiated with light is removed during development.

After applying or depositing an organic material for forming the planarization layer VIA on the passivation layer PV, the first mask HTM is located on the organic material. The first mask HTM may include a light transmitting portion HLT for transmitting light and a light blocking portion LC for blocking light. Accordingly, light may not be irradiated to the organic material corresponding to the light blocking portion LC. Light may be irradiated to the organic material corresponding to the light transmitting portion HLT.

When the organic material for forming the planarization layer VIA is the positive photoresist, a part of the organic material corresponding to the light transmitting portion HLT may be removed, and the organic material corresponding to the light blocking portion LC may not be removed. The light blocking portion LC may overlap the first alignment mark AK1 in the third direction DR3. Therefore, the first stepped portion STEP1 may be formed in a region that overlaps the first alignment mark AK1 in the third direction DR3. Due to the first stepped portion STEP1, the thickness T11+T12 of the planarization layer VIA that overlaps the first alignment mark AK1 in the third direction DR3 may be greater than the thickness T11 of the planarization layer VIA that does not overlap the first alignment mark AK1 in the third direction DR3. For example, the thickness T11+T12 of the planarization layer VIA that overlaps the first alignment mark AK1 in the third direction DR3 may be greater than the thickness T11 of the planarization layer VIA that overlaps the first electrode RME1 or the second electrode RME2 in the third direction DR3.

Figure 20:
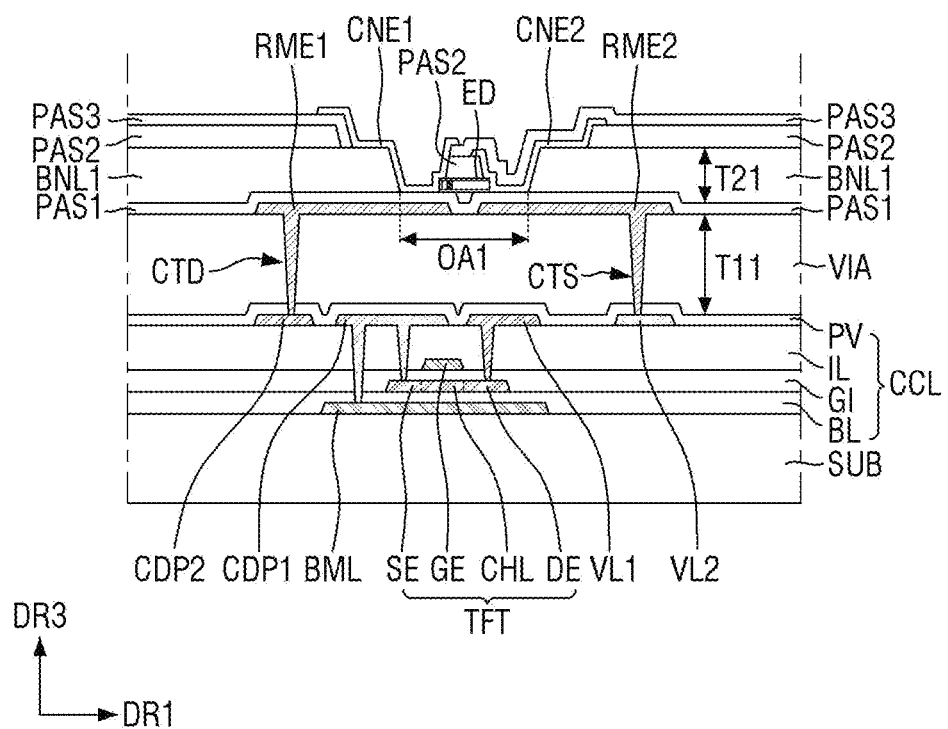
Figure 21:
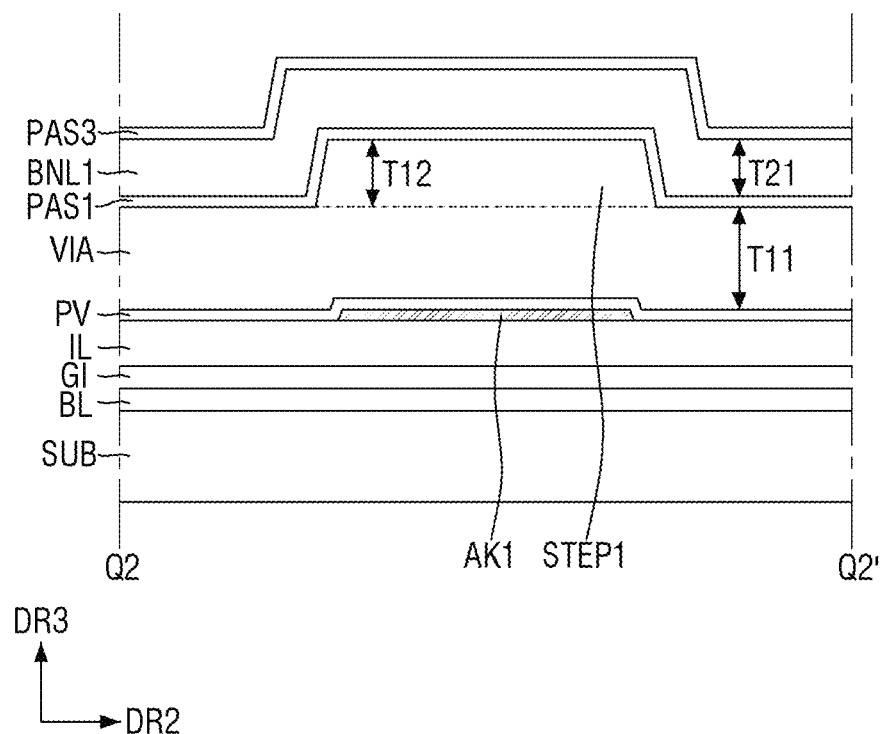

Third, as shown in FIGS. 20 and 21, the first electrode RME1, the second electrode RME2, the first bank BNL1, and the connection electrodes CNE1 and CNE2 are formed on the planarization layer VIA, and the light emitting elements ED are aligned (operation S130 in FIG. 15).

For example, the contact hole CTD exposing the second pattern electrode CDP2 and the contact hole CTS exposing the second power supply line VL2 are concurrently formed (e.g., simultaneously or substantially simultaneously formed) by penetrating the planarization layer VIA and the passivation layer PV by using the photolithography process.

Then, the first electrode RME1 and the second electrode RME2 are formed on the planarization layer VIA by using the photolithography process. The first electrode RME1 may be connected to the second pattern electrode CDP2 through the contact hole CTD exposing the second pattern electrode CDP2. The second electrode RME2 may be connected to the second power supply line VL2 through the contact hole CTS exposing the second power supply line VL2.

Then, an inorganic material is deposited on the first electrode RME1 and the second electrode RME2 to form the first insulating layer PAS1. Subsequently, the first bank BNL1 having a first opening area OA1 is formed on the first insulating layer PAS1. The first bank BNL1 may be formed of an organic layer such as acrylic resin, epoxy resin, phenolic resin, polyamide resin, or polyimide resin.

Then, a coating solution containing the light emitting elements ED is applied, a voltage is applied to the first electrode RME1 and the second electrode RME2 to align the light emitting elements ED, the coating solution is removed, and the second insulating layer PAS2 is formed on the light emitting elements ED and the first bank BNL1. The coating solution may be applied by inkjet printing, inkjet injection, slot dye coating, or slot dye printing. The coating solution may be located in the first opening area OA1.

Then, by applying a first driving voltage to the first electrode RME1 and applying a second driving voltage to the second electrode RME2, an electric field is formed between the first electrode RME1 and the second electrode RME2. The light emitting elements ED in the coating solution may be arranged such that one end of the light emitting element ED is located adjacent to the first electrode RME1 and the other end thereof is located adjacent to the second electrode RME2 by the electric field.

Then, by drying the coating solution, the coating solution may be removed except for the light emitting elements ED.

Subsequently, an inorganic material is deposited on the light emitting elements ED and the first bank BNL1 to form the second insulating layer PAS2.

Next, a contact hole penetrating the first insulating layer PAS1 to expose the first electrode RME1 and a contact hole penetrating the first insulating layer PAS1 to expose the second electrode RME2 are concurrently formed (e.g., simultaneously or substantially simultaneously formed) using the photolithography process.

Next, the second connection electrode CNE2 is formed on the first insulating layer PAS1, the first bank BNL1, and the second insulating layer PAS2 by using the photolithography process. The second connection electrode CNE2 may be brought into contact with the other end of the light emitting element ED and may be connected to the second electrode RME2 through a contact hole (e.g., the contact hole penetrating the first insulating layer PAS1 to expose the second electrode RME2).

Then, an inorganic material is deposited on the second connection electrode CNE2 and the second insulating layer PAS2 to form the third insulating layer PAS3.

Then, the first connection electrode CNE1 is formed on the first insulating layer PAS1, the second insulating layer PAS2, the first bank BNL1, and the third insulating layer PAS3 by using the photolithography process. The first connection electrode may be brought into contact with one end of the light emitting element ED and may be connected to the first electrode RME1 through a contact hole (e.g., the contact hole penetrating the first insulating layer PAS1 to expose the first electrode RME1).

Fourth, the second bank BNL2 is formed using the photolithography process (operation S140 in FIG. 15).

Figure 22:
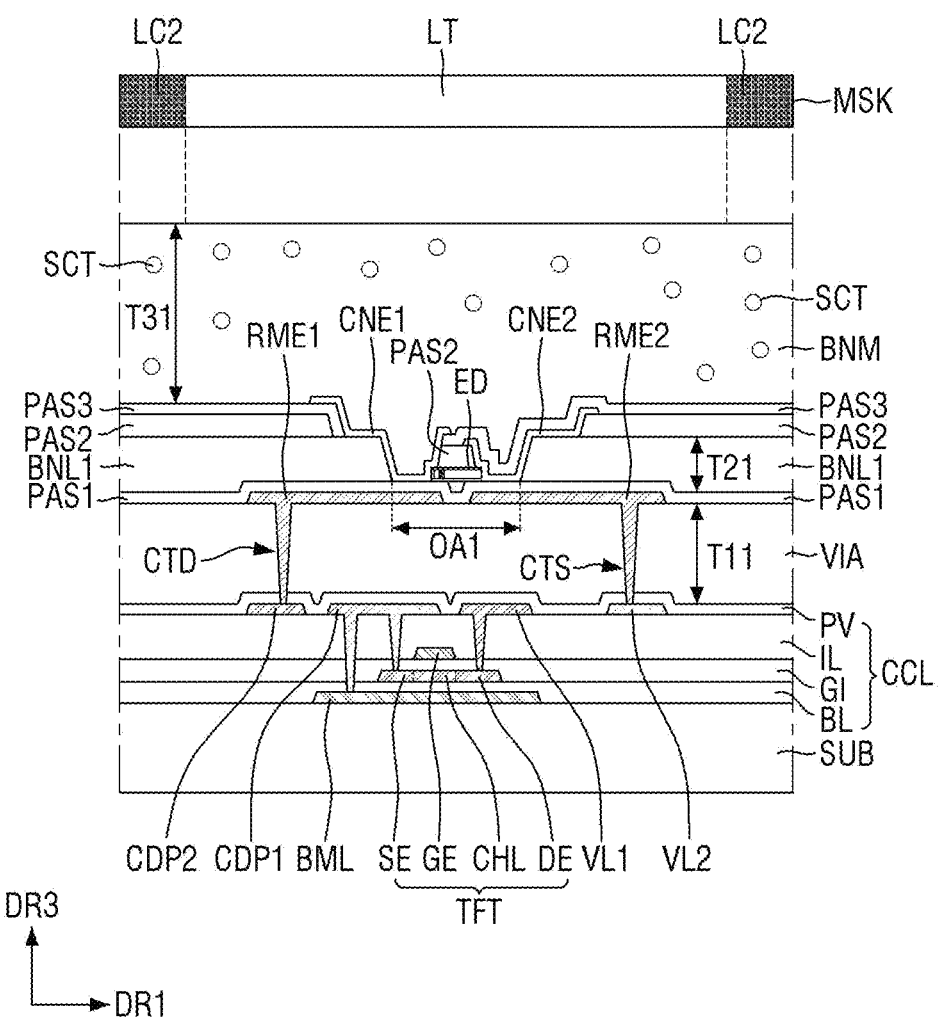
Figure 23:
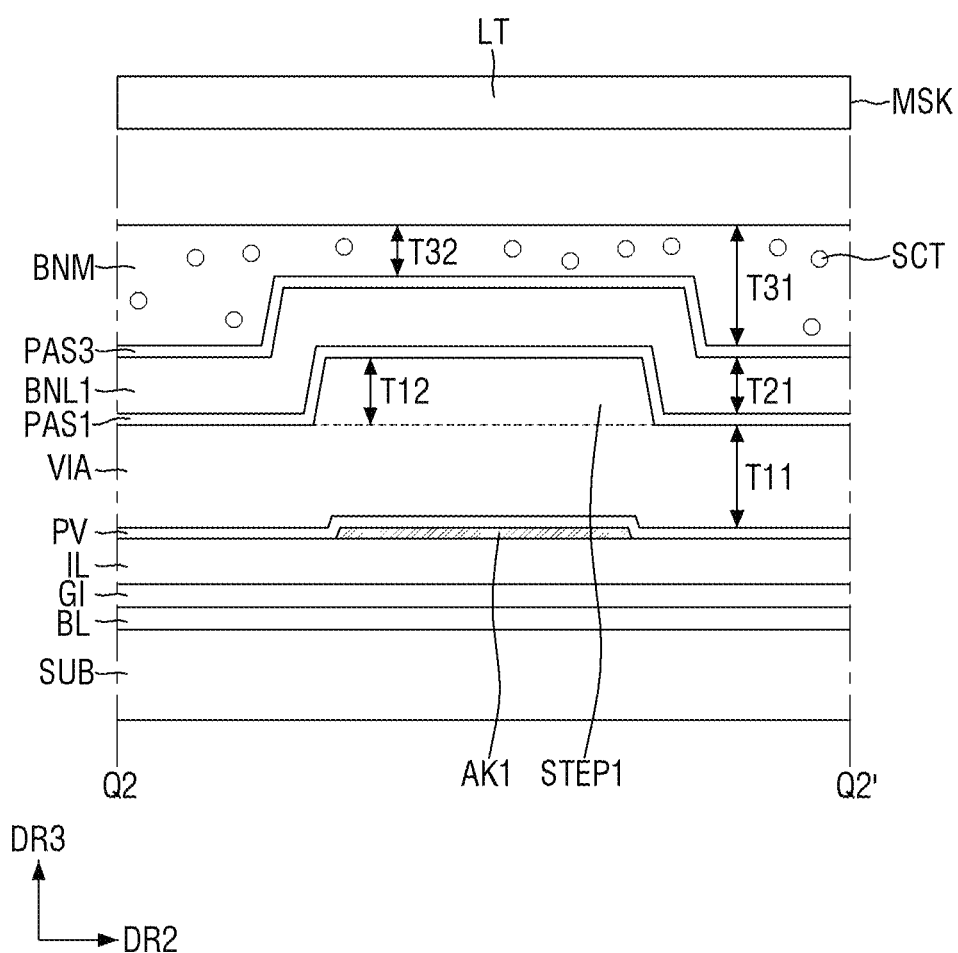
Figure 24:
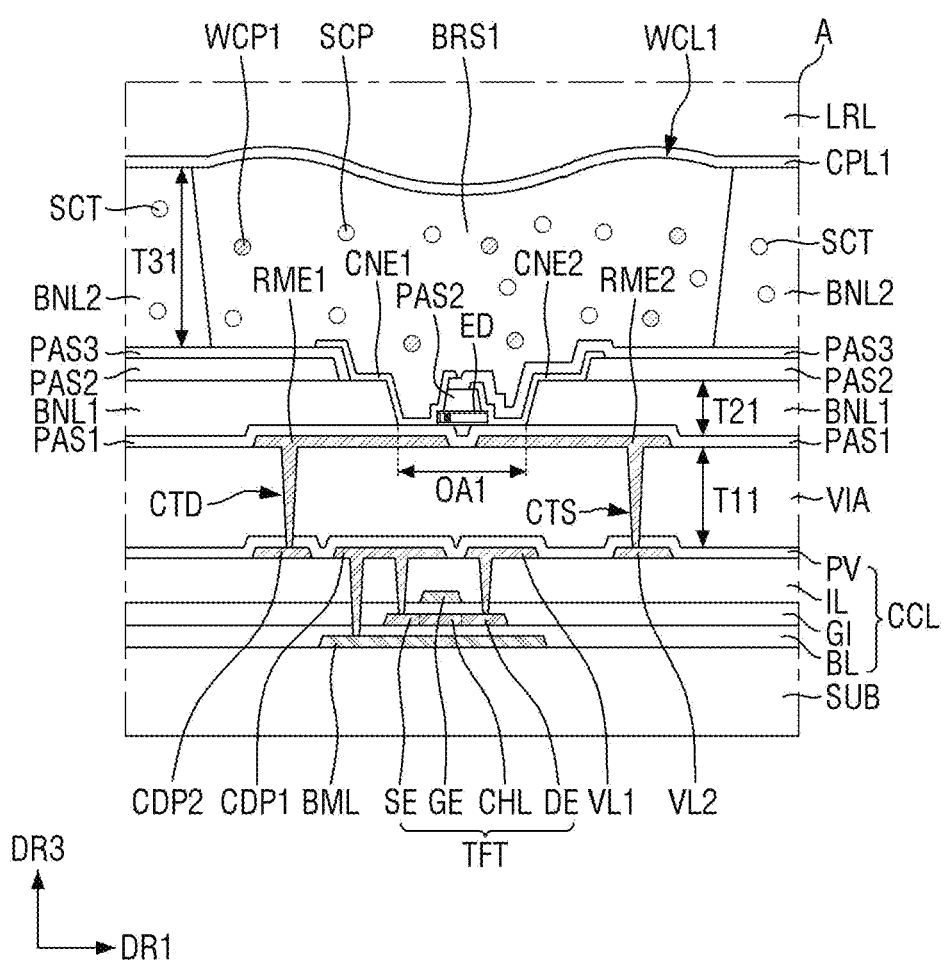
Figure 25:
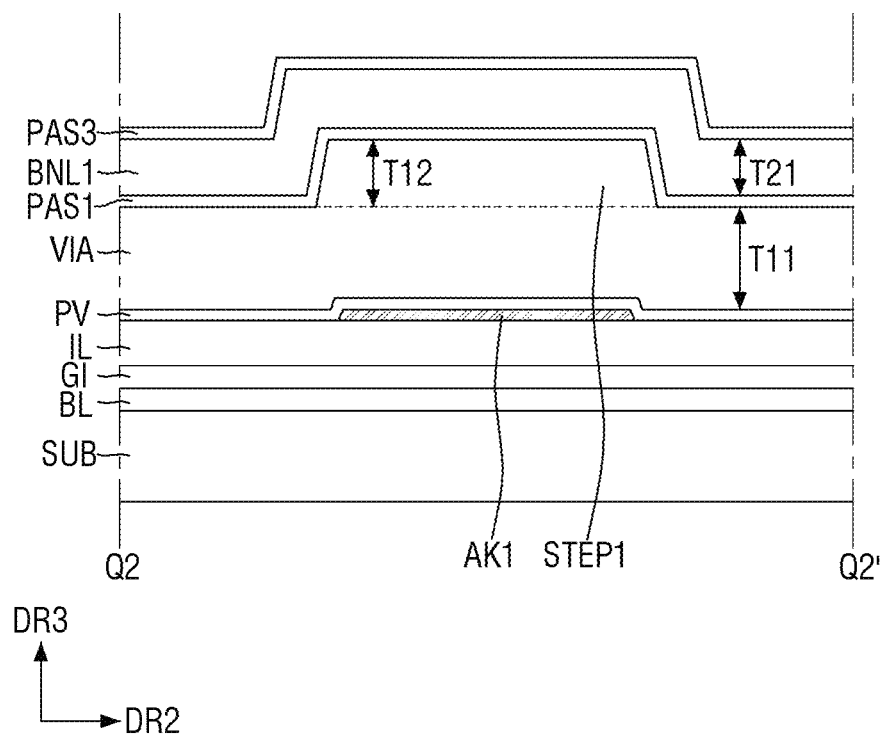

In FIGS. 22 and 23, the second bank BNL2 is illustrated as a positive photoresist in which a portion irradiated with light is removed during development, but is not limited thereto. The second bank BNL2 may be a negative photoresist in which a portion not irradiated with light is removed during development.

A bank material BNM for forming the second bank BNL2 is applied on the first connection electrode CNE1 and the third insulating layer PAS3, and then a second mask MSK is located on the bank material BNM. The bank material BNM may be an organic material including the scattering particles SCT. The bank material BNM may be applied by slit coating, and thus may be applied evenly.

The second mask MSK may include a light transmitting portion LT for transmitting light and a light blocking portion LC2 for blocking light. Accordingly, light may not be irradiated to the bank material BNM corresponding to the light blocking portion LC2. Light may be irradiated to the bank material BNM corresponding to the light transmitting portion LT. When the bank material BNM for forming the second bank BNL2 is the positive photoresist, all of the bank material BNM corresponding to the light transmitting portion LT may be removed, and the bank material BNM corresponding to the light blocking portion LC2 may remain. Accordingly, the second bank BNL2 may be formed in a region corresponding to the light blocking portion LC2 of the second mask MSK.

On the other hand, because the bank material BNM is applied evenly by slit coating, and because the first stepped portion STEP1 is formed in an area that overlaps the first alignment mark AK1 in the third direction DR3, a thickness T32 of the bank material BNM that overlaps the first alignment mark AK1 in the third direction DR3 may be smaller than a thickness T31 of the bank material BNM that does not overlap the first alignment mark AK1 in the third direction DR3. For example, the thickness T32 of the bank material BNM that overlaps the first alignment mark AK1 in the third direction DR3 may be smaller than the thickness T31 of the bank material BNM in contact with the first wavelength conversion layer WCL1, the second wavelength conversion layer WCL2, or the transparent insulating layer TPL. That is, the thickness T32 of the bank material BNM that overlaps the first alignment mark AK1 in the third direction DR3 may be smaller than the thickness T31 of the bank material BNM located in the light blocking portion BA of each of the sub-pixels SPX1, SPX2, and SPX3.

Because the light transmittance of the bank material BNM is inversely proportional to the thickness of the second bank BNL2, the light transmittance of the bank material BNM that overlaps the first alignment mark AK1 in the third direction DR3 may increase. Therefore, when the first stepped portion STEP1 is not formed, as shown in (a) of FIG. 28, it is difficult to recognize the first alignment mark AK1 between the first mask alignment mark AK21 and the second mask alignment mark AK22 by using the camera CCD. In contrast, when the first stepped portion STEP1 is formed, as shown in (b) of FIG. 28, it is possible to recognize the first alignment mark AK1 located between the first mask alignment mark AK21 and the second mask alignment mark AK22 by using the camera CCD. Accordingly, alignment accuracy between the display panel 100 and the second mask MSK may be improved.

Fifth, after forming the first wavelength conversion layer WCL1, the second wavelength conversion layer WCL2, and the transparent insulating layer TPL, the color filters CFL1, CFL2, and CFL3 are formed (operation S150 in FIG. 15).

For example, the first wavelength conversion layer WCL1 may be located in each of the first sub-pixels SPX1, the second wavelength conversion layer WCL2 may be located in each of the second sub-pixels SPX2, and the transparent insulating layer TPL may be located in each of the third sub-pixels SPX3.

Then, an inorganic material is deposited on the first wavelength conversion layer WCL1, the second wavelength conversion layer WCL2, and the transparent insulating layer TPL to form the first capping layer CPL1.

Subsequently, the low refractive layer LRL is formed by applying or depositing an organic material on the first capping layer CPL1.

Thereafter, the second capping layer CPL2 is formed by depositing an inorganic material on the low refractive layer LRL.

Next, the upper light absorbing member UBM is formed on the second capping layer CPL2.

Then, the first color filter CFL1 is formed to overlap the first wavelength conversion layer WCL1 in the third direction DR3, the second color filter CFL2 is formed to overlap second wavelength conversion layer WCL2 in the third direction DR3, and the third color filter CFL3 is formed to overlap the transparent insulating layer TPL in the third direction DR3.

Then, the overcoat layer OC is formed by depositing or coating an organic material on the color filters CFL1, CFL2, and CFL3 and the upper light absorbing member UBM.

Figure 26:
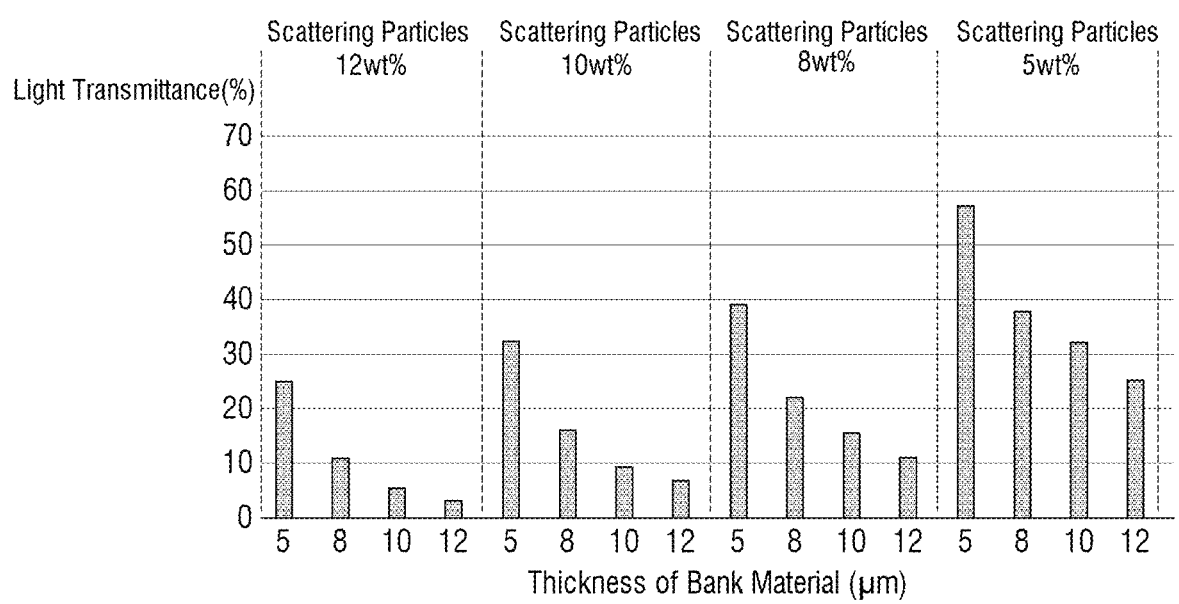
FIG. 26 is a graph showing the light transmittance of a bank material according to the thickness of the bank material and the weight ratio of scattering particles.

FIG. 26 is a graph showing the light transmittance of a bank material according to the thickness of the bank material and the weight ratio of scattering particles.

FIG. 26 illustrates the light transmittance of the bank material BNM when the weight ratio of the scattering particles SCT of the bank material BNM is 5 wt %, 8 wt %, 10 wt %, and 12 wt %, and the thickness of the bank material BNM is 5 μm, 8 μm, 10 μm, and 12 μm.

Referring to FIG. 26, as the weight ratio (wt %) of the scattering particles SCT of the bank material BNM increases, the light transmittance of the bank material BNM may decrease. In addition, as the thickness of the bank material BNM decreases, the light transmittance of the bank material BNM may increase. As the thickness of the first stepped portion STEP1 increases, the thickness of the bank material BNM may decrease. Therefore, as the thickness of the first stepped portion STEP1 increases, the light transmittance of the bank material BNM may increase.

To reduce or prevent the light emitted from the light emitting element ED of any one sub-pixel from traveling to the color filter of its adjacent sub-pixel to cause color mixture, the light transmittance of the second bank BNL2 may be about 15% or less. In contrast, to recognize the first alignment mark AK1 by using the camera CCD, the bank material BNM or the second bank BNL2 (see FIGS. 29 and 30) that overlaps the first alignment mark AK1 in the third direction DR3 may have a light transmittance of about 15% or more.

When the weight ratio of the scattering particles SCT of the bank material BNM is 8 wt %, to recognize the first alignment mark AK1 by using the camera CCD, the thickness T32 of the bank material BNM that overlaps the first alignment mark AK1 in the third direction DR3 may be 10 μm. When the thickness T31 of the bank material BNM that does not overlap the first alignment mark AK1 in the third direction DR3 is 12 μm, the thickness T12 of the first stepped portion STEP1 may be about 2 μm or more.

Alternatively, when the weight ratio of the scattering particles SCT of the bank material BNM is 10 wt %, to recognize the first alignment mark AK1 by using the camera CCD, the thickness T32 of the bank material BNM that overlaps the first alignment mark AK1 in the third direction DR3 may be 8 μm. When the thickness T31 of the bank material BNM that does not overlap the first alignment mark AK1 in the third direction DR3 is 12 μm, the thickness T12 of the first stepped portion STEP1 may be about 4 μm or more.

Alternatively, when the weight ratio of the scattering particles SCT of the bank material BNM is 12 wt %, to recognize the first alignment mark AK1 by using the camera CCD, the thickness T32 of the bank material BNM that overlaps the first alignment mark AK1 in the third direction DR3 may be approximately 7 μm. When the thickness T31 of the bank material BNM that does not overlap the first alignment mark AK1 in the third direction DR3 is 12 μm, the thickness T12 of the first stepped portion STEP1 may be about 5 μm or more.

In summary, when the weight ratio of the scattering particles SCT of the bank material BNM is about 8 wt % or more, the thickness T12 of the first stepped portion STEP1 may be about 2 μm or more and may be smaller than the thickness T31 of the second bank BNL2. In addition, the thickness T12 of the first stepped portion STEP1 may be smaller than the thickness T32 of the bank material BNM that overlaps the first alignment mark AK1 in the third direction DR3, but the present disclosure is not limited thereto. The thickness T12 of the first stepped portion STEP1 may be substantially equal to or greater than the thickness T32 of the bank material BNM that overlaps the first alignment mark AK1 in the third direction DR3.

In summary, by adjusting the thickness of the first stepped portion STEP1 according to the weight ratio of the scattering particles SCT of the bank material BNM, the first alignment mark AK1 may be recognized using the camera CCD.

Figure 27:
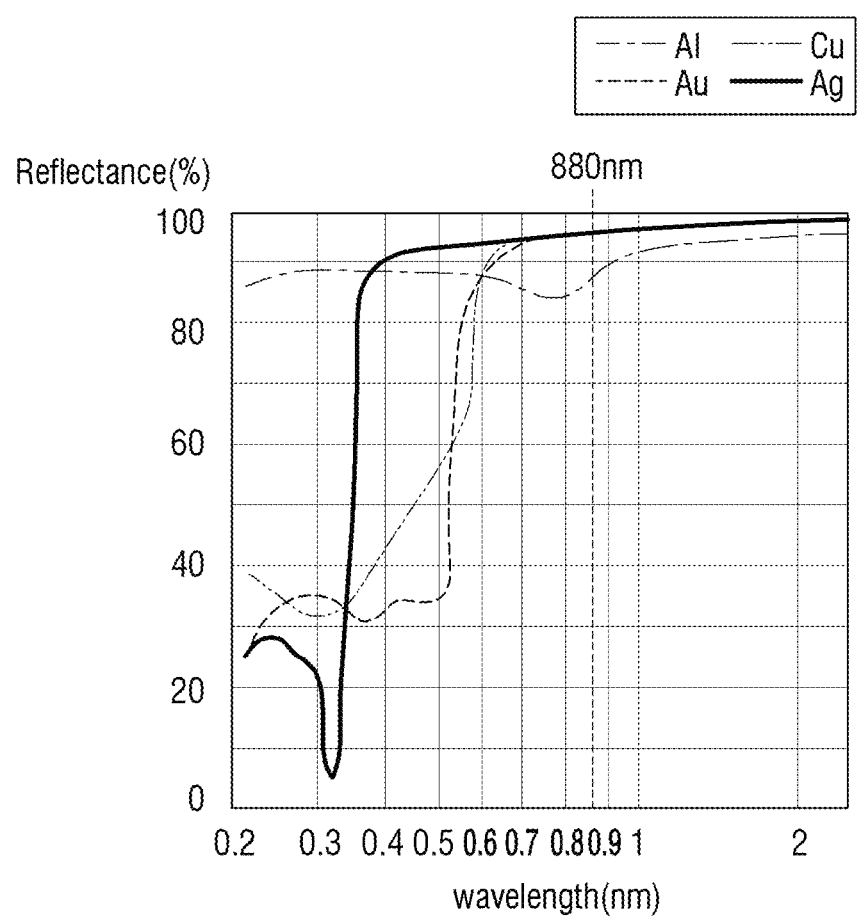
FIG. 27 is a graph showing the reflectance with respect to the wavelength of light, depending on a metal material of a first alignment mark.
Figure 28:
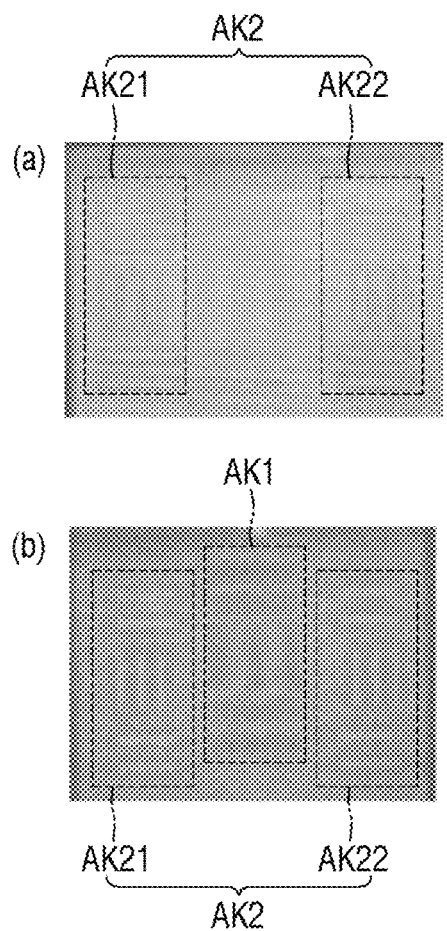
FIG. 28 is an example view showing whether a first alignment mark is recognized according to the height adjustment of a scattering bank.

FIG. 27 is a graph showing the reflectance with respect to the wavelength of light, depending on a metal material of a first alignment mark. FIG. 27 shows the light reflectance of aluminum (Al), copper (Cu), gold (Au), and silver (Ag) for each wavelength band.

As the reflectance of the first alignment mark AK1 is higher, it may be easier to recognize the first alignment mark AK1 by using the camera CCD. To this end, the first alignment mark AK1 may be formed of a metal material having a reflectance of about 50% or more. Alternatively, the first alignment mark AK1 may be formed of a metal material having a reflectance of about 80% or more at a wavelength of substantially approximately about 700 nm to about 1200 nm. Alternatively, as shown in FIG. 27, the first alignment mark AK1 may be formed of a metal material, e.g., aluminum (Al), copper (Cu), gold (Au), or silver (Ag), having a reflectance of about 80% or more at a wavelength of substantially approximately 880 nm. Alternatively, the first alignment mark AK1 may be formed of an alloy containing at least one of aluminum (Al), copper (Cu), gold (Au), or silver (Ag). For example, the first alignment mark AK1 may be a titanium copper alloy (Ti Cu alloy) having a reflectance of about 95% or more at a wavelength of substantially approximately 880 nm.

When the first alignment mark AK1 is located on the interlayer insulating layer IL, the first pattern electrode CDP1, the second pattern electrode CDP2, the first power supply line VL1, and the second power supply line VL2 located at the same layer as the first alignment mark AK1 may be formed of a metal material having a high reflectance, similar to the first alignment mark AK1. Alternatively, when the first alignment mark AK1 is located on the gate insulating layer GI, the gate electrode GE of the thin film transistor TFT located at the same layer as the first alignment mark AK1 may be formed of a metal material having a high reflectance, similarly to the first alignment mark AK1. Alternatively, when the first alignment mark AK1 is located on the substrate SUB, the light blocking layer BML located at the same layer as the first alignment mark AK1 may be formed of a metal material having a high reflectance, similar to the first alignment mark AK1. Alternatively, when the first alignment mark AK1 is located on the planarization layer VIA, the first electrode RME1 and the second electrode RME2 located at the same layer as the first alignment mark AK1 may be formed of a metal material having a high reflectance, similar to the first alignment mark AK1.

Figure 29:
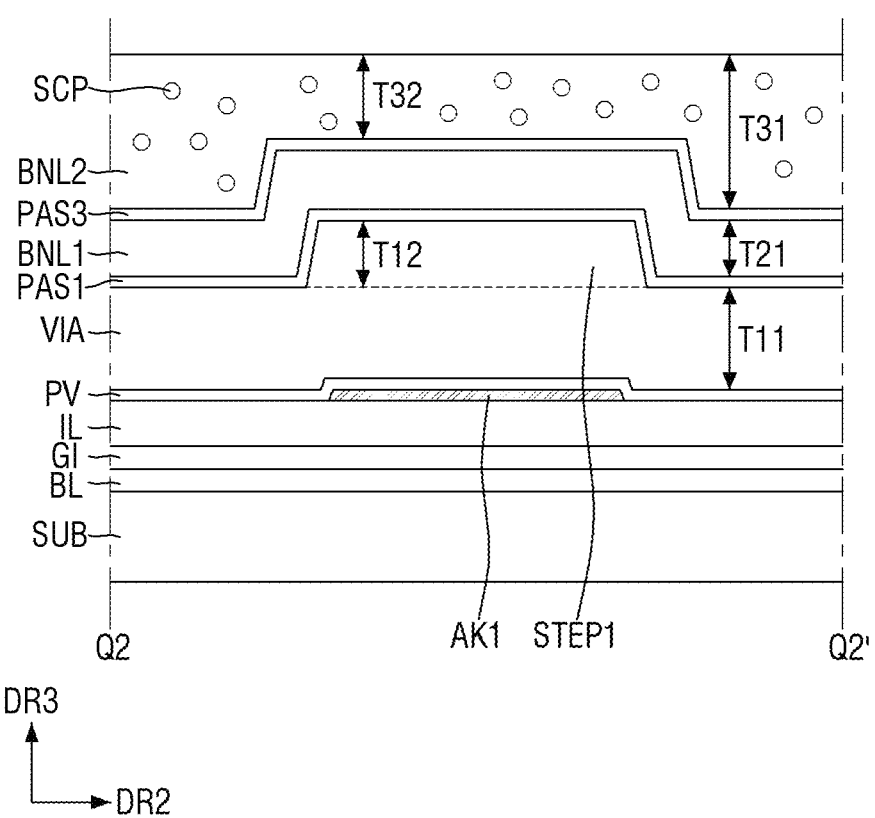
FIG. 29 is a cross-sectional view illustrating an example of a display panel taken along the line Q2-Q2' of (a) of FIG. 4.

FIG. 29 is a cross-sectional view illustrating an example of a display panel taken along the line Q2-Q2' of (a) of FIG. 4.

Embodiments corresponding to FIG. 29 differs from embodiments corresponding to FIG. 10 in that the second bank BNL2 is located in an area that overlaps the first alignment mark AK1. In FIG. 29, the differences from embodiments corresponding to FIG. 10 will be mainly described.

Referring to FIG. 29, due to the first stepped portion STEP1, the first insulating layer PAS1, the first bank BNL1, and the third insulating layer PAS3 located on the planarization layer VIA may be formed along the cross-sectional shape of the first stepped portion STEP1. Accordingly, the thickness T32 of the second bank BNL2 that overlaps the first alignment mark AK1 in the third direction DR3 may be smaller than the thickness T31 of the second bank BNL2 that does not overlap the first alignment mark AK1 in the third direction DR3. Because the light transmittance of the second bank BNL2 is inversely proportional to the thickness of the second bank BNL2, the light transmittance of the second bank BNL2 that overlaps the first alignment mark AK1 in the third direction DR3 may be higher than the light transmittance of the second bank BNL2 that does not overlap the first alignment mark AK1 in the third direction DR3. Accordingly, even if the second bank BNL2 is formed on the first alignment mark AK1, the first alignment mark AK1 may be recognized using the camera CCD as shown in FIG. 3.

Figure 30:
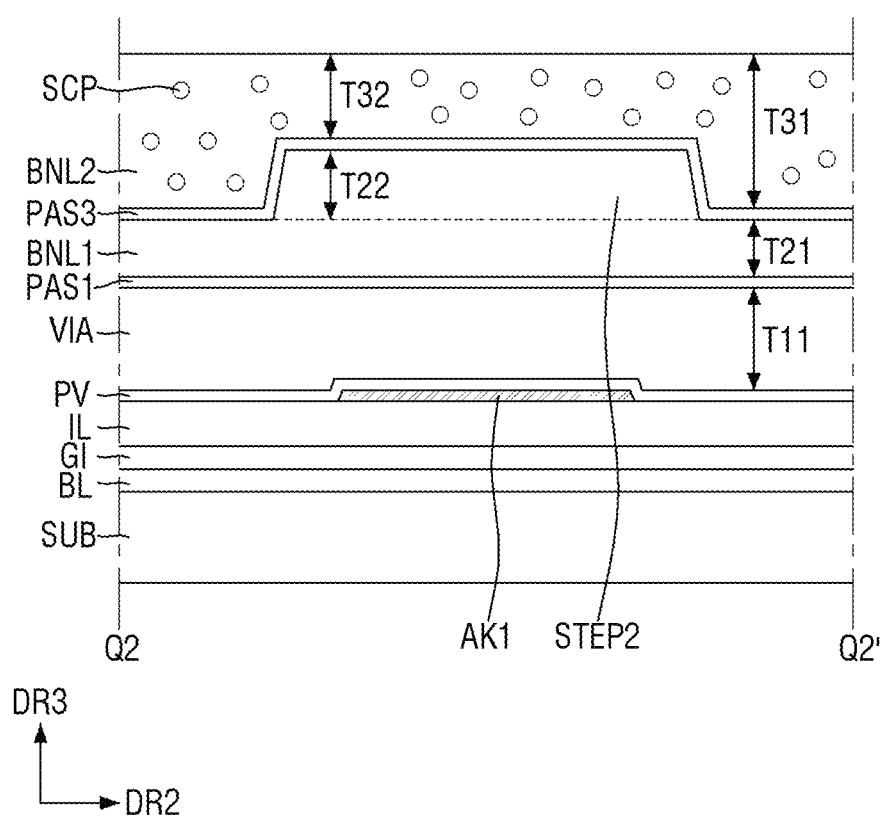
FIG. 30 is a cross-sectional view illustrating an example of a display panel taken along the line Q2-Q2' of (a) of FIG. 4.

FIG. 30 is a cross-sectional view illustrating an example of a display panel taken along the line Q2-Q2' of (a) of FIG. 4.

Embodiments corresponding to FIG. 30 differs from embodiments corresponding to FIG. 11 in that the second bank BNL2 is located in an area that overlaps the first alignment mark AK1. In FIG. 30, the differences from embodiments corresponding to FIG. 11 will be mainly described.

Referring to FIG. 30, due to the second stepped portion STEP2, the third insulating layer PAS3 located on the first bank BNL1 may be formed along the cross-sectional shape of the first stepped portion STEP1. Accordingly, the thickness T32 of the second bank BNL2 that overlaps the first alignment mark AK1 in the third direction DR3 may be smaller than the thickness T31 of the second bank BNL2 that does not overlap the first alignment mark AK1 in the third direction DR3. Because the light transmittance of the second bank BNL2 is inversely proportional to the thickness of the second bank BNL2, the light transmittance of the second bank BNL2 that overlaps the first alignment mark AK1 in the third direction DR3 may be higher than the light transmittance of the second bank BNL2 that does not overlap the first alignment mark AK1 in the third direction DR3. Accordingly, even if the second bank BNL2 is formed on the first alignment mark AK1, the first alignment mark AK1 may be recognized using the camera CCD as shown in FIG. 3.

Figure 31:
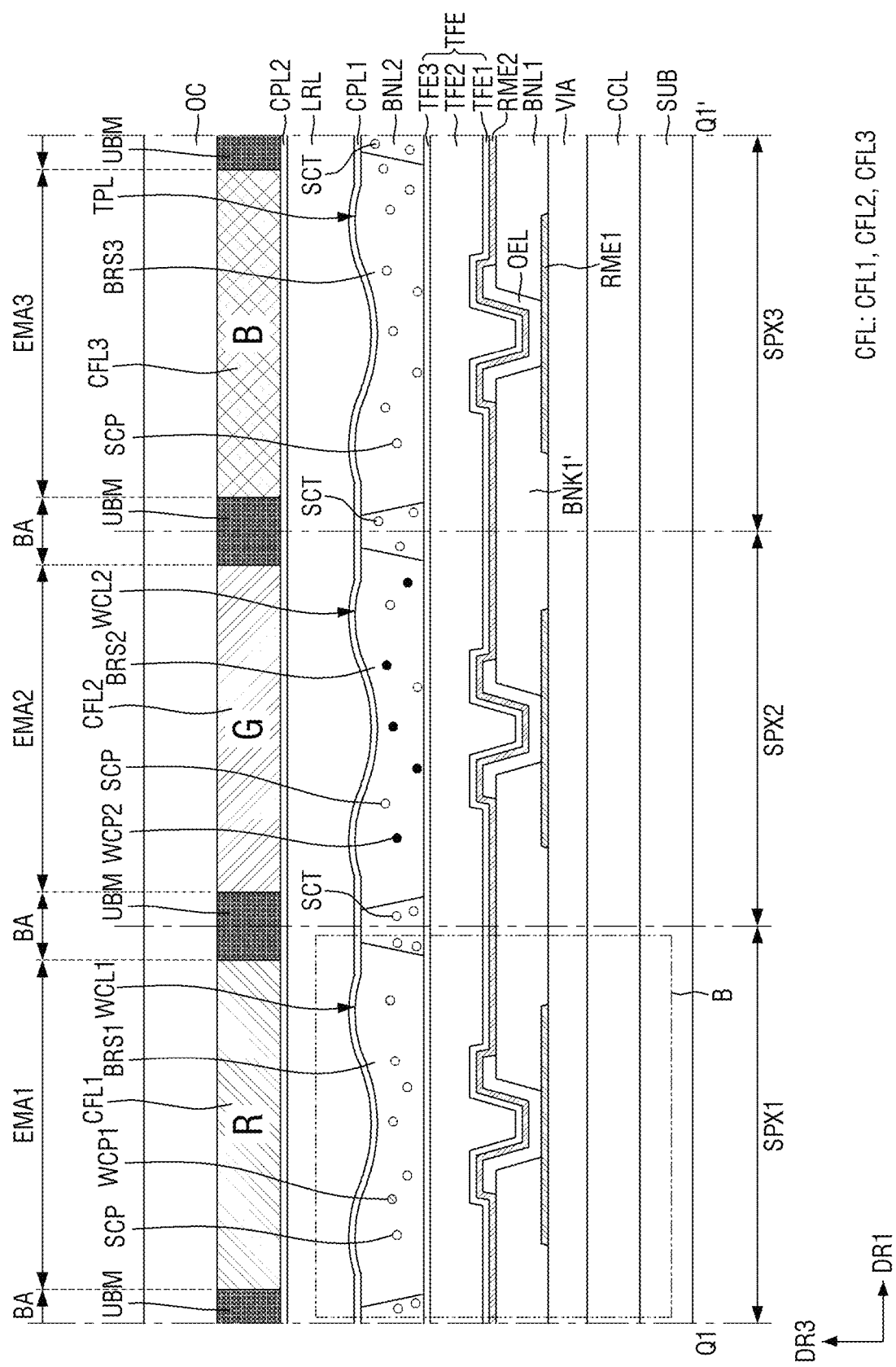
FIG. 31 is a cross-sectional view illustrating an example of a display panel taken along the line Q1-Q1' of FIG. 6.
Figure 32:
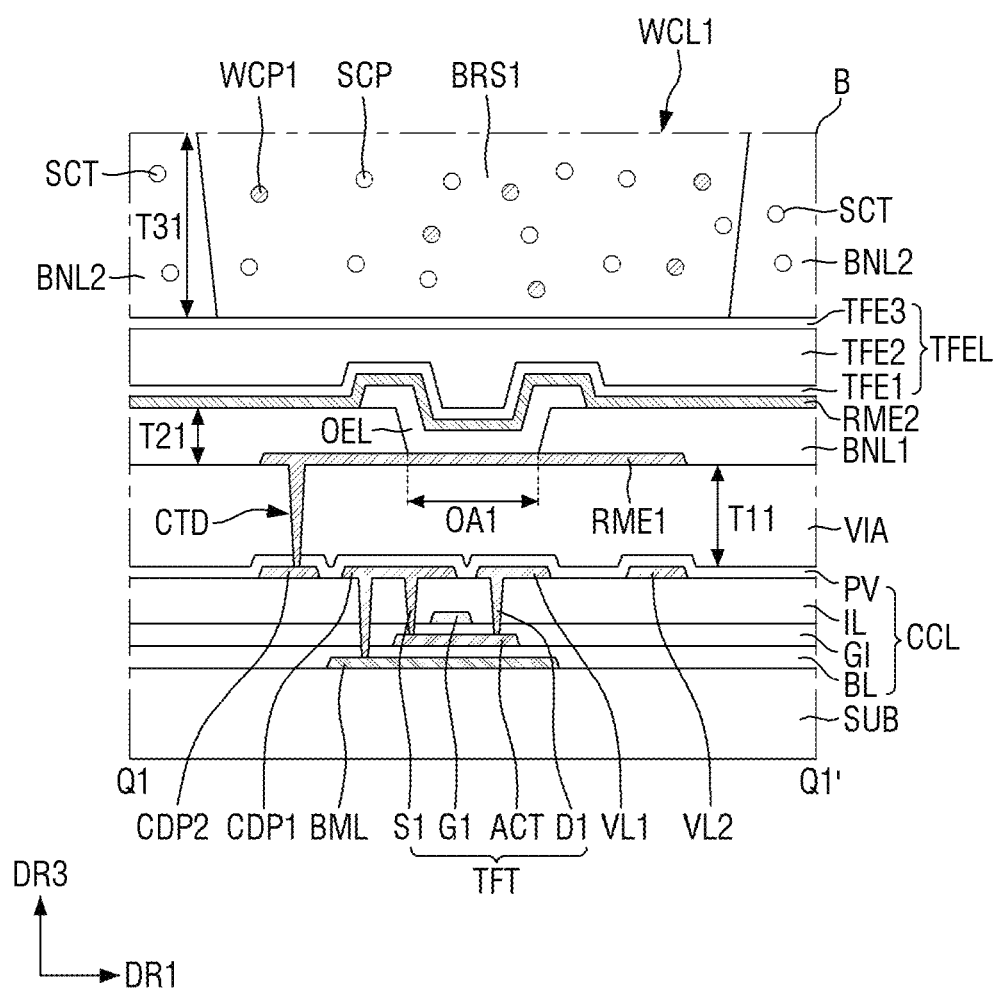
FIG. 32 is a cross-sectional view illustrating an area B of FIG. 31 in detail.

FIG. 31 is a cross-sectional view illustrating an example of a display panel taken along the line Q1-Q1' of FIG. 6. FIG. 32 is a cross-sectional view illustrating area B of FIG. 31 in detail.

Embodiments corresponding to FIGS. 31 and 32 differs from embodiments corresponding to FIGS. 7 and 8 in that an organic light emitting element OEL is included instead of the light emitting element ED of the inorganic semiconductor element. The description being made with reference to FIGS. 31 and 32 is mainly directed to the differences from embodiments corresponding to FIGS. 7 and 8.

Referring to FIGS. 31 and 32, the first electrode RME1 may be located on the planarization layer VIA. The first electrode RME1 may be connected to the second pattern electrode CDP2 through a contact hole CTD penetrating the planarization layer VIA.

In a top emission structure that emits light toward the second electrode RME2 with respect to the organic light emitting element OEL, the first electrode RME1 may be formed of a metal material having a high reflectance, such as a stacked structure (Ti/Al/Ti) of aluminum and titanium, a stacked structure (ITO/Al/ITO) of aluminum and indium tin oxide (ITO), an APC alloy, or a stacked structure (ITO/APC/ITO) of an APC alloy and ITO. The APC alloy is an alloy of silver (Ag), palladium (Pd) and copper (Cu).

The first bank BNL1 may be formed to partition the first electrode RME1 on the planarization layer VIA, to define the first light emitting portion EMA1, the second light emitting portion EMA2, and the third light emitting portion EMA3 of the sub-pixels SPX1, SPX2, and SPX3. The first bank BNL1 may be located to cover the edge of the first electrode RME1. The first bank BNL1 may be formed of an organic layer such as acryl resin, epoxy resin, phenolic resin, polyamide resin, polyimide resin and the like.

Each of the first light emitting portion EMA1, the second light emitting portion EMA2, and the third light emitting portion EMA3 of the sub-pixels SPX1, SPX2, and SPX3 represents a region in which the first electrode RME1, the organic light emitting element OEL, and the second electrode RME2 are sequentially stacked and holes from the first electrode RME1 and electrons from the second electrode RME2 are coupled to each other in the organic light emitting element OEL to emit light.

The organic light emitting element OEL may be located on the first electrode RME1 and the first bank BNL1. The organic light emitting element OEL may include an organic material layer that emits light of the third color. For example, the organic light emitting element OEL may include a hole transporting layer, an organic material layer, and an electron transporting layer.

The second electrode RME2 may be located on the organic light emitting element OEL. The second electrode RME2 may be located to cover the organic light emitting element OEL. The second electrode RME2 may be a common layer formed in common in the first light emitting portion EMA1, the second light emitting portion EMA2, and the third light emitting portion EMA3 of the sub-pixels SPX1, SPX2, and SPX3. A capping layer may be formed on the second electrode RME2.

The second electrode RME2 may be formed of a transparent conductive material (TCO) such as ITO or IZO that can transmit light or a semi-transmissive conductive material such as magnesium (Mg), silver (Ag), or an alloy of Mg and Ag. When the second electrode RME2 is formed of a semi-transmissive conductive material, the light emission efficiency can be increased due to a micro-cavity effect.

An encapsulation layer TFEL may be located on the second electrode RME2. The encapsulation layer TFEL includes at least one inorganic layer to prevent oxygen or moisture from penetrating into the light emitting element layer. In addition, the encapsulation layer TFEL includes at least one organic layer to protect the light emitting element layer from foreign substances such as dust. For example, the encapsulation layer TFEL includes a first encapsulation inorganic layer TFE1, an encapsulation organic layer TFE2, and a second encapsulation inorganic layer TFE3.

The first encapsulation inorganic layer TFE1 may be located on the second electrode RME2, the encapsulation organic layer TFE2 may be located on the first encapsulation inorganic layer TFE1, and the second encapsulation inorganic layer TFE3 may be located on the encapsulation organic layer TFE2. The first inorganic encapsulation layer TFE1 and the second inorganic encapsulation layer TFE3 may be formed as multiple layers in which one or more inorganic layers of a silicon nitride layer, a silicon oxynitride layer, a silicon oxide layer, a titanium oxide layer and an aluminum oxide layer are alternately stacked. The encapsulation organic layer TFE2 may be an organic layer such as acryl resin, epoxy resin, phenolic resin, polyamide resin, polyimide resin or the like. The second bank BNL2, the first wavelength conversion layer WCL1, the second wavelength conversion layer WCL2, and the transparent insulating layer TPL may be located on the encapsulation layer TFEL.

Figure 33:
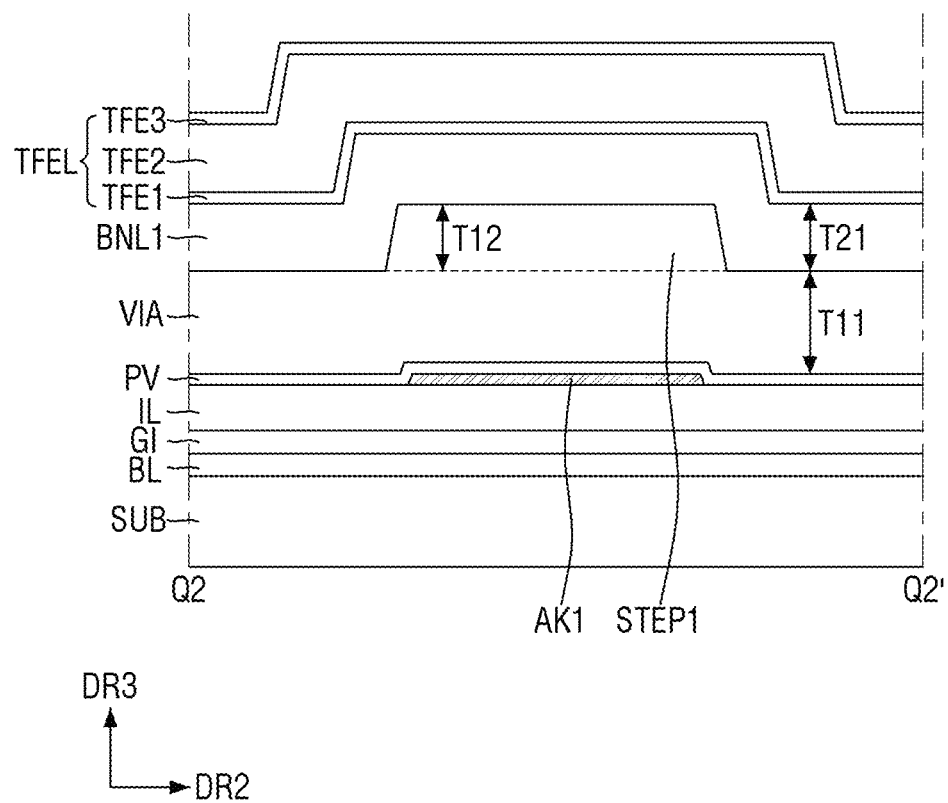
FIG. 33 is a cross-sectional view illustrating an example of a display panel taken along the line Q2-Q2' of FIG. 4.

FIG. 33 is a cross-sectional view illustrating an example of a display panel taken along the line Q2-Q2' of FIG. 4.

Embodiments corresponding to FIG. 33 differs from embodiments corresponding to FIG. 10 only in that the first insulating layer PAS1 and the third insulating layer PAS3 are removed, and the encapsulation layer TFEL is added on the first bank BNL1. Therefore, a description of FIG. 33 is omitted.

Figure 34:
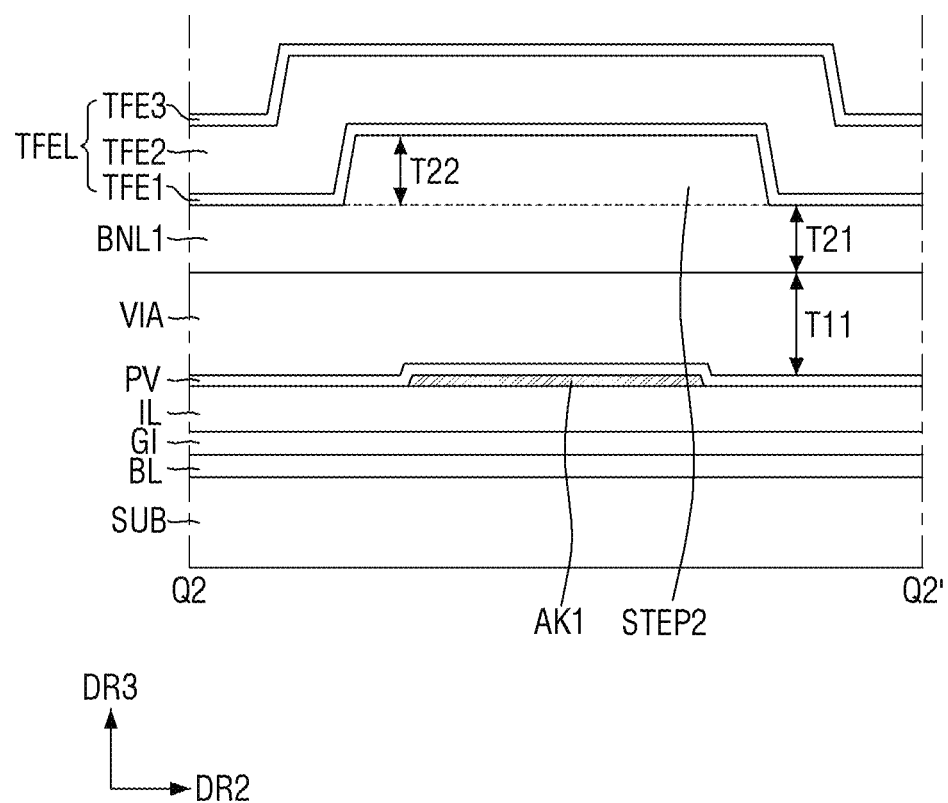
FIG. 34 is a cross-sectional view illustrating an example of a display panel taken along the line Q2-Q2' of FIG. 4.

FIG. 34 is a cross-sectional view illustrating an example of a display panel taken along the line Q2-Q2' of FIG. 4.

Embodiments corresponding to FIG. 34 differs from embodiments corresponding to FIG. 11 only in that the first insulating layer PAS1 and the third insulating layer PAS3 are removed, and the encapsulation layer TFEL is added on the first bank BNL1. Therefore, a description of FIG. 34 is omitted.

Figure 35:
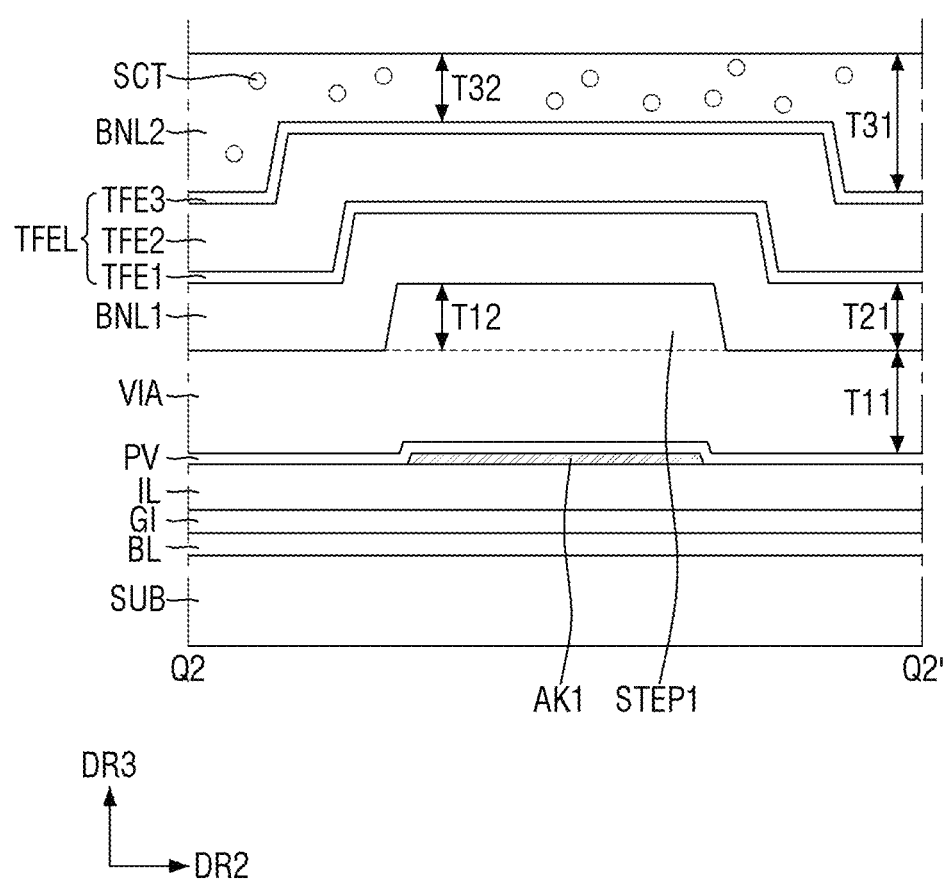
FIG. 35 is a cross-sectional view illustrating an example of a display panel taken along the line Q2-Q2' of FIG. 4.

FIG. 35 is a cross-sectional view illustrating an example of a display panel taken along the line Q2-Q2' of FIG. 4.

Embodiments corresponding to FIG. 35 differs from embodiments corresponding to FIG. 29 only in that the first insulating layer PAS1 and the third insulating layer PAS3 are removed, and the encapsulation layer TFEL is added on the first bank BNL1. Therefore, a description of FIG. 35 is omitted.

Figure 36:
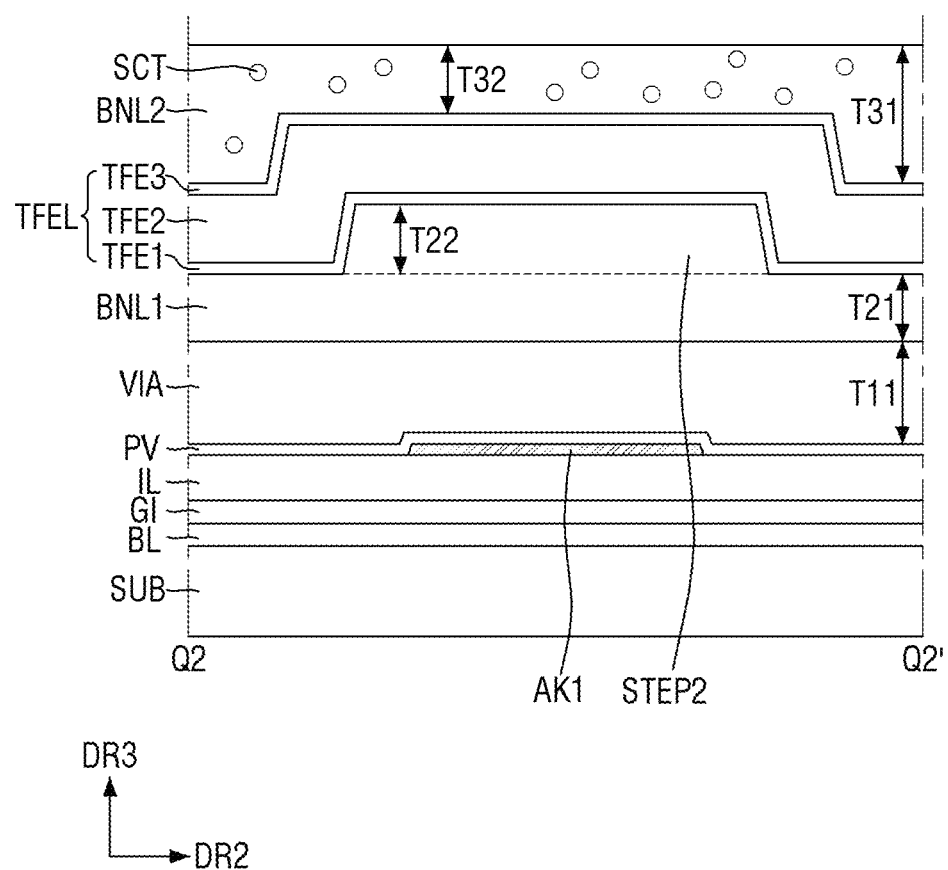
FIG. 36 is a cross-sectional view illustrating an example of a display panel taken along the line Q2-Q2' of (a) of FIG. 4.

FIG. 36 is a cross-sectional view illustrating an example of a display panel taken along the line Q2-Q2' of (a) of FIG. 4.

Embodiments corresponding to FIG. 36 differs from embodiments corresponding to FIG. 30 only in that the first insulating layer PAS1 and the third insulating layer PAS3 are removed, and the encapsulation layer TFEL is added on the first bank BNL1. Therefore, a description of FIG. 36 is omitted. The embodiments of the present disclosure are also defined in the following claims, and equivalents thereof.

What is claimed is:
1. A display device comprising:
   a substrate;
   a planarization layer on the substrate;
   a first alignment mark in a non-display area of the substrate;
   a first electrode and a second electrode in a display area of the substrate and spaced from each other in a first direction perpendicular to a thickness direction of the substrate, the first electrode and the second electrode being at a same layer and on a same plane in a cross section;
   a light emitting element electrically connected to the first electrode and the second electrode;
   a wavelength conversion layer on the light emitting element;
   a first bank on at least a part of the first electrode; and
   a second bank on the first bank to be around the wavelength conversion layer,
   wherein a thickness of a part of the planarization layer that overlaps the first alignment mark in the thickness direction of the substrate is greater than a thickness of a part of the planarization layer that overlaps the first electrode and the second electrode in the thickness direction of the substrate,
   wherein at least a part of the second bank overlaps the first alignment mark in the thickness direction of the substrate, and
   wherein a thickness of the part of the second bank that overlaps the first alignment mark is less than a thickness of a part of the second bank in contact with the wavelength conversion layer.
2. The display device of claim 1, wherein the planarization layer comprises a stepped portion that overlaps the first alignment mark in the thickness direction of the substrate.

3. The display device of claim 2, wherein a thickness of the stepped portion is less than the thickness of the part of the second bank in contact with the wavelength conversion layer.

4. The display device of claim 3, wherein the thickness of the stepped portion is about 2 µm or more.

5. The display device of claim 1, wherein a light transmittance of the part of the second bank that overlaps the first alignment mark is greater than a light transmittance of the part of the second bank in contact with the wavelength conversion layer.

6. The display device of claim 1, wherein a light transmittance of the part of the second bank in contact with the wavelength conversion layer is about 15% or less, and a light transmittance of the part of the second bank that overlaps the first alignment mark is about 15% or more.

7. The display device of claim 1, further comprising:
a barrier layer on the substrate;
a channel layer of a thin film transistor on the barrier layer;
a gate insulating layer on the channel layer of the thin film transistor;
a gate electrode of the thin film transistor on the gate insulating layer;
an interlayer insulating layer on the gate electrode of the thin film transistor; and
a first power supply line on the interlayer insulating layer,
wherein a first power voltage is applied to the first power supply line.

8. The display device of claim 7, wherein the first alignment mark is on the interlayer insulating layer and comprises same material as that of the first power supply line.

9. The display device of claim 7, wherein the first alignment mark is on the gate insulating layer and comprises same material as the gate electrode of the thin film transistor.

10. The display device of claim 7, further comprising a light blocking layer on the substrate,
wherein the barrier layer is on the light blocking layer, and
wherein the first alignment mark is on the substrate and comprises same material as the light blocking layer.

11. The display device of claim 1, wherein the first alignment mark comprises same material as the first electrode.

12. The display device of claim 1, wherein the first alignment mark comprises a metal material having a reflectance of about 80% or more with respect to light having a wavelength of about 880 nm.

13. A display device comprising:
a substrate;
a first alignment mark in a non-display area of the substrate;
a first electrode and a second electrode in a display area of the substrate and spaced from each other in a first direction perpendicular to a thickness direction of the substrate, the first electrode and the second electrode being at a same layer and on a same plane in a cross section;
a light emitting element electrically connected to the first electrode and the second electrode;
a wavelength conversion layer on the light emitting element;
a first bank on at least a part of the first electrode; and
a second bank on the first bank to be around the wavelength conversion layer,
wherein a thickness of a part of the first bank that overlaps the first alignment mark in the thickness direction of the substrate is greater than a thickness of a part of the first bank that overlaps the first electrode and the second electrode in the thickness direction of the substrate,
wherein at least a part of the second bank overlaps the first alignment mark in the thickness direction of the substrate, and
wherein a thickness of the part of the second bank that overlaps the first alignment mark is less than a thickness of a part of the second bank in contact with the wavelength conversion layer.

14. The display device of claim 13, wherein the first bank comprises a stepped portion that overlaps the first alignment mark in the thickness direction of the substrate.

15. The display device of claim 14, wherein a thickness of the stepped portion is less than the thickness of the part of the second bank in contact with the wavelength conversion layer.

16. The display device of claim 14, wherein a thickness of the stepped portion is about 2 µm or more, and is less than the thickness of the part of the second bank in contact with the wavelength conversion layer.

* * * * *